(12) United States Patent
Mui et al.

(10) Patent No.: US 7,498,106 B2
(45) Date of Patent: *Mar. 3, 2009

(54) METHOD AND APPARATUS FOR CONTROLLING ETCH PROCESSES DURING FABRICATION OF SEMICONDUCTOR DEVICES

(75) Inventors: David S L Mui, Fremont, CA (US); Wei Liu, San Jose, CA (US); Hiroki Sasano, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 465 days.

This patent is subject to a terminal disclaimer.

(21) Appl. No.: 11/263,780

(22) Filed: Oct. 31, 2005

(65) Prior Publication Data

US 2006/0091108 A1    May 4, 2006

Related U.S. Application Data

(63) Continuation of application No. 10/428,145, filed on May 1, 2003, now Pat. No. 6,960,416, which is a continuation-in-part of application No. 10/238,453, filed on Sep. 9, 2002, now Pat. No. 6,858,361.

(60) Provisional application No. 60/463,757, filed on Apr. 18, 2003, provisional application No. 60/361,064, filed on Mar. 1, 2002.

(51) Int. Cl.
    *G01B 11/14*    (2006.01)
(52) U.S. Cl. .............................. 430/30; 430/313; 438/7; 156/345.24; 355/40; 355/55; 216/59
(58) Field of Classification Search ........................ None
    See application file for complete search history.

(56) References Cited

U.S. PATENT DOCUMENTS

| | | | |
|---|---|---|---|
| 4,447,731 A | 5/1984 | Kuni et al. | |
| 4,767,496 A | 8/1988 | Hieber | |
| 4,911,103 A | 3/1990 | Davis et al. | |
| 5,109,430 A | 4/1992 | Nishihara et al. | |
| 5,171,393 A | 12/1992 | Moffat | |
| 5,452,521 A | 9/1995 | Niewmierzycki | |
| 5,653,894 A | 8/1997 | Ibbotsen et al. | |
| 5,798,529 A | 8/1998 | Wagner | |
| 5,913,102 A | 6/1999 | Yang | |
| 5,926,690 A | 7/1999 | Toprac et al. | |
| 5,944,940 A | 8/1999 | Toshima | |
| 5,948,203 A | 9/1999 | Wang | |
| 5,963,329 A | 10/1999 | Conrad et al. | |
| 5,980,766 A | 11/1999 | Flamm et al. | |
| 6,001,699 A | 12/1999 | Nguyen et al. | |
| 6,004,706 A | 12/1999 | Ausschnitt et al. | |
| 6,007,675 A | 12/1999 | Toshima | |
| 6,027,842 A | 2/2000 | Ausschnitt et al. | |
| 6,033,814 A | 3/2000 | Burdorf et al. | |
| 6,054,710 A | 4/2000 | Bruggeman | |
| 6,124,212 A | 9/2000 | Fan et al. | |
| 6,143,081 A | 11/2000 | Shinriki et al. | |
| 6,148,239 A | 11/2000 | Funk et al. | |
| 6,161,054 A | 12/2000 | Rosenthal et al. | |
| 6,175,417 B1 | 1/2001 | Do et al. | |
| 6,178,239 B1 | 1/2001 | Kishinsky et al. | |
| 6,225,639 B1 | 5/2001 | Adams et al. | |
| 6,245,581 B1 | 6/2001 | Bonser et al. | |
| 6,368,975 B1 | 4/2002 | Balasubramhanya et al. | |
| 6,388,253 B1 | 5/2002 | Su | |
| 6,413,867 B1 | 7/2002 | Sarfaty et al. | |
| 6,454,417 B1 | 9/2002 | Takamoto et al. | |
| 6,455,437 B1 | 9/2002 | Davidow et al. | |
| 6,479,309 B1 | 11/2002 | Wright | |
| 6,486,492 B1 | 11/2002 | Su | |
| 6,501,555 B1 | 12/2002 | Ghandehari et al. | |
| 6,606,738 B1 | 8/2003 | Bell et al. | |
| 6,625,497 B2 | 9/2003 | Fairbairn et al. | |
| 6,762,130 B2 | 7/2004 | Laaksonen et al. | |
| 6,960,416 B2 | 11/2005 | Mui et al. | |
| 2002/0072003 A1 | 6/2002 | Brill et al. | |
| 2002/0155629 A1 | 10/2002 | Fairbairn et al. | |
| 2002/0160628 A1 | 10/2002 | Okoroanyanwu et al. | |
| 2002/0171828 A1 | 11/2002 | Cohen et al. | |

(Continued)

FOREIGN PATENT DOCUMENTS

EP    0 727 715    8/1996

(Continued)

OTHER PUBLICATIONS

Anthony J. Toprac, "AMD's Advanced Process Control of Poly-gate Critical Dimension", SPIE Conference on Process, Equipment and Materials Control in Integrated Circuit Manufacturing, Sep. 1999, Santa Clara, CA. SPIE, vol. 3882.

(Continued)

*Primary Examiner*—Daborah Chacko Davis
(74) *Attorney, Agent, or Firm*—Patterson & Sheridan, LLP

(57) ABSTRACT

A method for controlling etch processes during fabrication of semiconductor devices comprises tests and measurements performed on non-product and product substrates to define an N-parameter CD control graph that is used to calculate a process time for trimming a patterned mask to a pre-determined width. An apparatus for performing such a method.

18 Claims, 19 Drawing Sheets

U.S. PATENT DOCUMENTS

| | | |
|---|---|---|
| 2003/0000922 A1 | 1/2003 | Subramanian et al. |
| 2003/0045098 A1 | 3/2003 | Verhaverbeke et al. |
| 2003/0092281 A1 | 5/2003 | Ramachandramurthy et al. |
| 2003/0228532 A1 | 12/2003 | Mui et al. |

FOREIGN PATENT DOCUMENTS

| | | |
|---|---|---|
| EP | 1 079 428 | 2/2001 |
| EP | 1 083 424 | 3/2001 |
| JP | 61 290312 | 12/1986 |
| WO | WO 01/09934 | 2/2001 |
| WO | WO 01/84382 | 11/2001 |
| WO | WO 02/09170 | 1/2002 |
| WO | WO 02/37186 | 5/2002 |

OTHER PUBLICATIONS

Ausschnit, Christopher P., et al., "Seeing the Forest for the Trees: A New Approach to CD Control," Ed. Bhanwar Singh, Proceeding of the SPIE, vol. 3332, pp. 212-220, Feb. 23-25, 1998.

Chateau, Nicolas, "Algorithm for the Rigorous Coupled-Wave Analysis of Grating Diffusion," Journal of the Optical Society of America, vol. 11, No. 4, pp. 1321-1331, Apr. 1994.

Davidson, et al., An Inverse Scattering Approach to SEM Line Width Measurements:, Technical Program and Abstract Digest, SPIE's 24th International Symposium on Microlithography, Mar. 1999, Santa Clara, CA.

Kota, et al., "Integrated CD Metrolog for Poly Si Etching", Lam Research Corporation, Plasma Etch Users Group Meeting, Jan. 17, 2002.

Kota, et al., "Advanced Process Control for Polysilicon Gate Etching Using Integrated Optical CD Metrology", Proceedings of SPIE, vol. 5044 (2003) pp. 90-96.

Lee, M.E., "Analysis of Reflectometry and Ellipsometry Data from Patterned Structures", Characterization and Metrology for ULSI Technology: 1998 International Conference, ed. D.G. Seiler, et al., 1998, pp. 331-335.

McIntosh, J.M., et al., "Approach to CD SEM Metrology Utilizing the Full Waveform Signal", Proceedings of the SPIE, vol. 3332, pp. 51-60, Feb. 23, 1998.

Moharam, M.G., et al., "Stable Implementation of the Rigorous Coupled-Wave Analysis for Surface-Relief Gratings: Enhanced Transmittance Matrix Approach," Journal of the Optical Society of America, vol. 12, No. 5, pp. 1077-1086, May 1995.

Raymond, Christopher J., "Angle-Resolved Scatterometry of Semiconductor Manufacturing", Microlithography World, Winter 2000, pp. 18-23.

Yang, et al., "Line-Profile and Critical Dimension Measurements Using a Normal Incidence Optical Metrology System," Proceedings of SPIE vol. 4689, Mar. 2002.

US 6,150,664, 11/2000, Su (withdrawn)

METHOD AND APPARATUS FOR CONTROLLING ETCH PROCESSES DURING FABRICATION OF SEMICONDUCTOR DEVICES

CROSS-REFERENCE TO RELATED APPLICATIONS

This application is a continuation of U.S. patent application Ser. No. 10/428,145, filed May 1, 2003, now U.S. Pat. No. 6,960,416 which application is a continuation-in-part of U.S. patent application Ser. No. 10/238,453, filed Sep. 9, 2002, now U.S. Pat. No. 6,858,361 which claims benefit of United States which provisional patent application Ser. No. 60/361,064, filed Mar. 1, 2002, and which application Ser. No. 10/428,145, claims benefit of U.S. provisional patent application Ser. No. 60/463,757, filed Apr. 18, 2003. Each of the aforementioned related patent applications is herein incorporated by reference.

BACKGROUND OF THE INVENTION

1. Field of the Invention

The present invention generally relates to semiconductor substrate processing systems. More specifically, the present invention relates to controlling etch processes in a semiconductor substrate processing system.

2. Description of the Related Art

To increase operational speed, devices (e.g., transistors, capacitors, and the like) in integrated microelectronic circuits have become ever smaller. The minimal dimensions of features of such devices are commonly called in the art, critical dimensions, or CDs. The CDs generally include the minimal widths of the features, such as lines, columns, openings, spaces between the lines, and the like.

One method of fabricating such features comprises forming a patterned mask (e.g., photoresist mask) on the material layer beneath such a mask (i.e., underlying layer) and then etching the material layer using the patterned mask as an etch mask.

The patterned masks are conventionally fabricated using a lithographic process when a pattern of the feature to be formed is optically transferred into a layer of photoresist. Then, the photoresist is developed, unexposed portions of the photoresist are removed, while the remaining photoresist forms a patterned mask.

An etch mask generally is, in a plan view, a replica of the feature to be formed (i.e., etched) in the underlying layer. As such, the etch mask comprises elements having same critical dimensions as the feature to be formed. Optical limitations of the lithographic process may not allow transferring a dimensionally accurate image of a feature into the photoresist layer when a CD of the element is smaller than optical resolution of the lithographic process.

To overcome limitations of the lithographic process, the photoresist mask may be fabricated using a two-step process. During a first step, the lithographic process is used to form the mask having elements that dimensions that are proportionally greater (i.e., scaled up) than the dimensions of the features to be formed. During a second step, such scaled-up elements are trimmed (i.e., isotropically etched) to the pre-determined dimensions. The trimmed photoresist mask is then used as an etch mask during etching the underlying material layer or layers.

Dimensional accuracy of the etch features generally defined by the corresponding elements of the trimmed photoresist mask. Manufacturing variables of the trimming process result in a broad statistical distribution (i.e., a large $\sigma$, where is $\sigma$ a standard deviation) of the CDs within a group (i.e., batch) of the wafers. When such trimmed photoresist masks are used as the etch masks, critical dimensions of the etched features may be beyond an acceptable range for such dimensions, i.e., the features may be defective.

Therefore, there is a need in the art for an improved method and apparatus for controlling etch processes during fabrication of semiconductor devices in a semiconductor substrate processing system.

SUMMARY OF THE INVENTION

The present invention is a method for controlling etch processes during fabrication of semiconductor devices in a semiconductor substrate processing system. The method comprises pre-determined tests and measurements that are performed on non-product and product substrates. In one embodiment, the method is used to define an N-parameter critical dimension (CD) control graph that is used to calculate a process time for trimming a patterned mask to a pre-determined width. An apparatus for performing the inventive method comprises an etch reactor, a processor and a tool for measuring characteristics of the patterned mask and/or the etched feature.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

Figure 1:
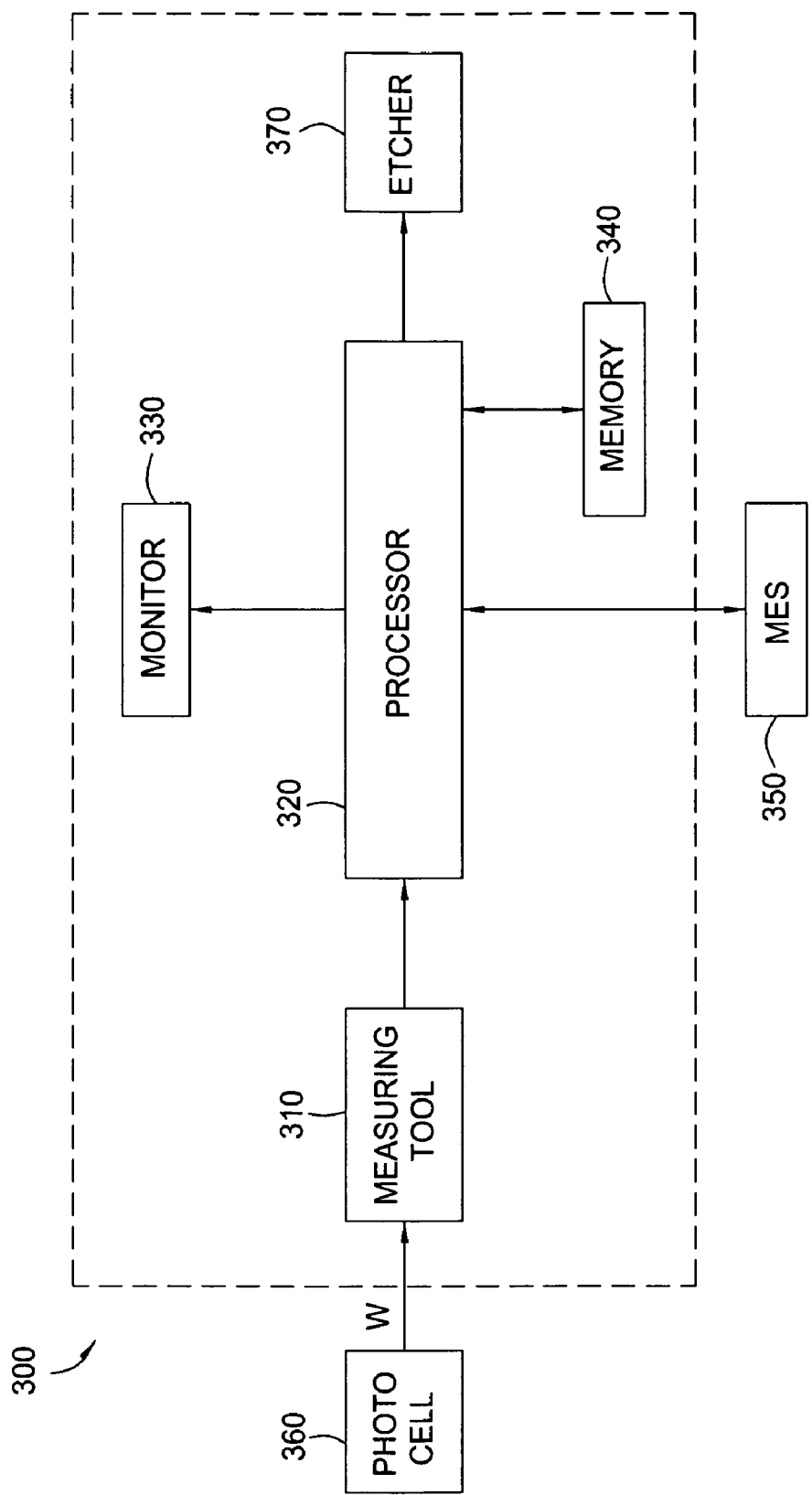
FIG. 1 is a block diagram of an apparatus according to an embodiment of the present invention.

It is to be noted, however, that the appended drawings illustrate only exemplary embodiments of this invention and are therefore not to be considered limiting of its scope, for the invention may admit to other equally effective embodiments.

DETAILED DESCRIPTION

A first embodiment of the present invention utilizes optical CD (OCD) metrology to inspect every wafer to determine pre-etch CD and profile, then uses the inspection results to determine process parameters, such as resist trim time and/or etch parameters. In further embodiments of the invention, OCD metrology is used post-trim and/or post-etch to inspect wafers to determine the post-trim and/or post-etch CD and profile. The invention then uses the post-trim and/or post-etch information to develop an N-parameter trim surface for controlling various parameter of the trim process and/or etch process on subsequently processed wafers. In this way, the present invention enables accurate final CD and profile dimensions. The present invention addresses the problem of CD control by reducing CD variation by feeding forward and backward information relating to photoresist mask CD and profile to adjust (1) the next process the inspected wafer will undergo (e.g., the photoresist trim process); or (2) adjust processes for future wafers. In certain embodiments of the present invention, pre-etch CD and profile measurement, etching, cleaning, and post-etch CD measurement are performed entirely under controlled environmental conditions. By providing etching, cleaning and measurement tools on a mainframe and/or factory interface, a wafer can be etched, cleaned and inspected before being returned to a cassette, thereby reducing processing time and cost.

OCD metrology techniques as employed by the present invention are advanced process control (APC) enablers and utilize novel technology to the CD measurement world where the current SEM-based systems are becoming inadequate. For example, normal incidence spectroscopic OCD metrology systems provide detailed line profiles not possible with in-line non-destructive SEMs. The compact size and speed of OCD technology enables the measurement system of the present invention to be fully integrated into a process tool, such as Applied Materials' DPSII etch system. When combined with APC software, this provides a complete, feed-forward solution for wafer-to-wafer closed loop control.

An example of a processing step that benefits from the complete feedforward solution of the present invention is etch processing that is sensitive to incoming photoresist (PR) dimensions. CD control is particularly critical for gate etch, in which the device speed is determined by the final gate CD. Here, the variation in incoming resist mask CD creates a proportional variation in the final etched CD. Measuring the incoming resist CD prior to etching enables the etch process to be tuned to compensate for the variations due to lithography.

According to the methodology of the present invention, an underlying layer, such as a conductive layer, is formed on a wafer, and a patterned layer, such as a photoresist mask, is formed on the underlying layer, as by a photolithography process at a "photo cell" (e.g., exposure at a stepper followed by photoresist development). A pattern on the mask is inspected using an integrated metrology unit, such as an optical inspection tool, to determine its CD and profile. The wafer is then transferred to a conventional etch chamber, where the measured photoresist CD and profile are used by the processor to adjust the photoresist trim recipe (e.g., the trim time), also taking into account the implicit etch uniformity performance of the etcher and the nonlinearity of the trim curve.

The underlying layer is thereafter etched using the trimmed photoresist pattern as a mask. After etching, the wafer is optionally cleaned, as by an ash photoresist strip followed by a wet cleaning step, and transferred back to the integrated metrology unit, where the CD, profile and depth of features formed by the etch process are measured and compared to the desired dimensions. Such information can be fed back to the processor (e.g., to compensate for etch process drift or photo cell problems) by adjustment of the trim recipe when etching the next wafer.

By taking into account photoresist CD and profile variation when choosing a resist trim recipe, the present invention decouples post-etch CD from pre-etch CD and profile. By measuring the incoming resist CD and adjusting the trim time, the etch process can compensate for variations in lithography on successive wafers. With automatic compensation of incoming resist CD from the lithography step, a much tighter distribution of post-etch CD is achieved by the present invention, and the final CD uniformity becomes a realistic etch specification without impacting the productivity of the etch tool.

To optimize production efficiency, post-etch measurements for closed loop control must be made directly on the wafer before it leaves the etcher. CDSEM measurement can require time-consuming wet cleaning, particularly when etch byproducts cling to the sidewalls of the etched structure. Such deposits render top-down CDSEM post-etch measurements inaccurate. Optical CD (OCD) metrology is insensitive to thin layers of deposits, making it possible to take accurate in-situ post-etch measurements, eliminate the cycle time penalty of wet cleaning, and immediately feed back data to the process controller. The accuracy of this technique was confirmed by comparing pre-clean and post-clean post-etch OCD measurements from nine locations on a hardmask polysilicon gate wafer. Results showed an average difference of 0.06 nm and a standard deviation of 0.3 nm, well within the resolution of the measurement tool.

An exemplary embodiment of the present invention is implemented using an inspection tool in a processing line 300, as shown in FIG. 1, comprising a measuring tool 310, e.g., an optical inspection tool such as the Nano OCD 9000 available from Nanometrics of Milpitas, Calif., or an optical imager as disclosed in U.S. Pat. No. 5,963,329. Optical measuring tool 310 can utilize scatterometry or reflectometry techniques. The use of scatterometry for inspection tools is disclosed in Raymond, "Angle-resolved scatterometry for semiconductor manufacturing", *Microlithography World*, Winter 2000. The use of reflectometry for inspection is taught in Lee, "Analysis of Reflectometry and Ellipsometry Data from Patterned Structures", *Characterization and Metrology for ULSI Technology:* 1998 *International Conference*, The American Institute of Physics 1998.

Processing line 300 further comprises a processor 320, which performs the analysis disclosed herein electronically, and a monitor 330 for displaying results of the analyses of processor 320. Processor 320 can be in communication with a memory device 340, such as a semiconductor memory, and a computer software-implemented database system 350 known as a "manufacturing execution system" (MES) conventionally used for storage of process information. Processor 320 can also be in communication with previously-described photo cell 360 and etcher 370.

Figure 2:
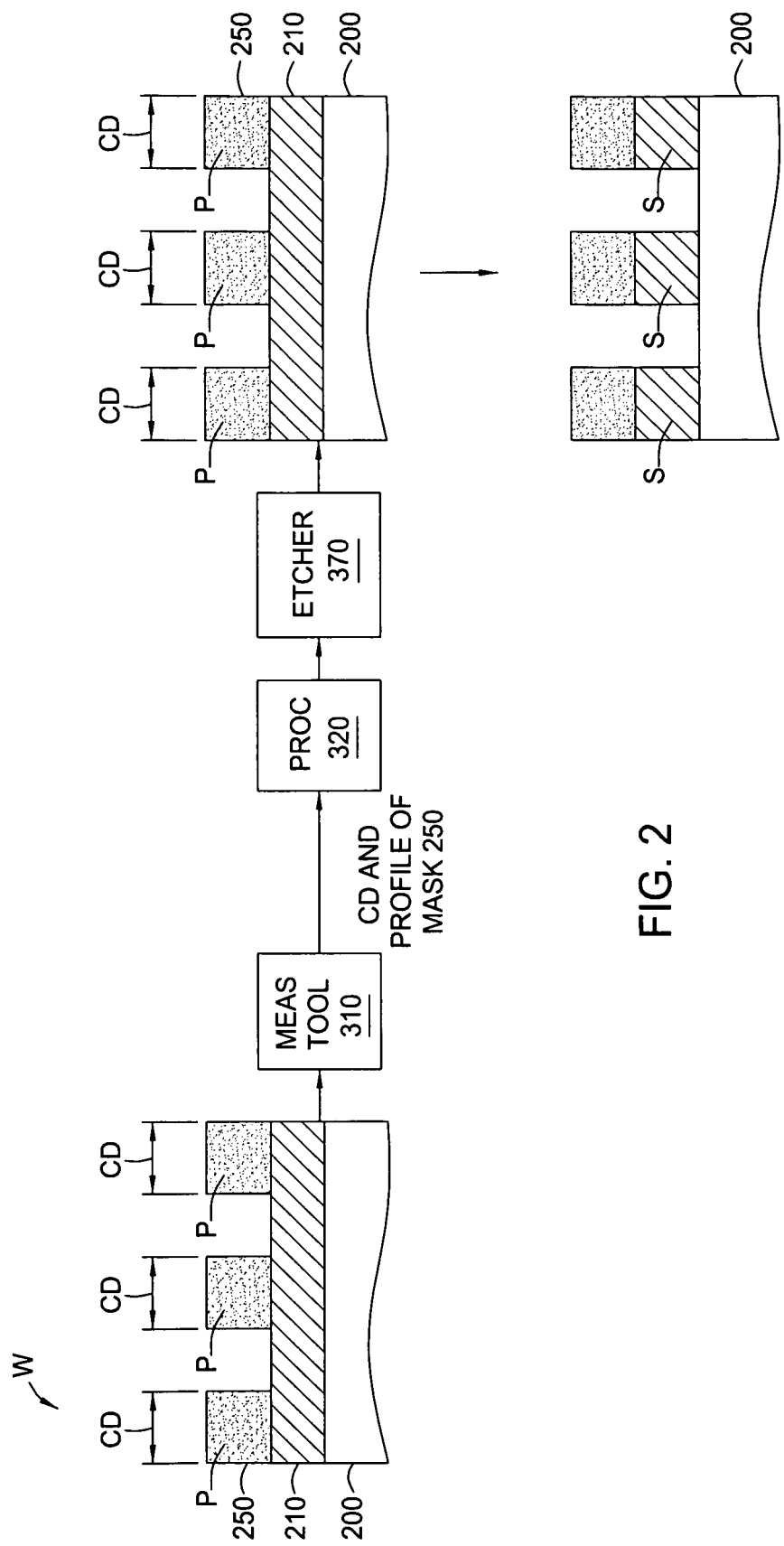
FIG. 2 is a process flow diagram for an embodiment of the present invention.
Figure 3:
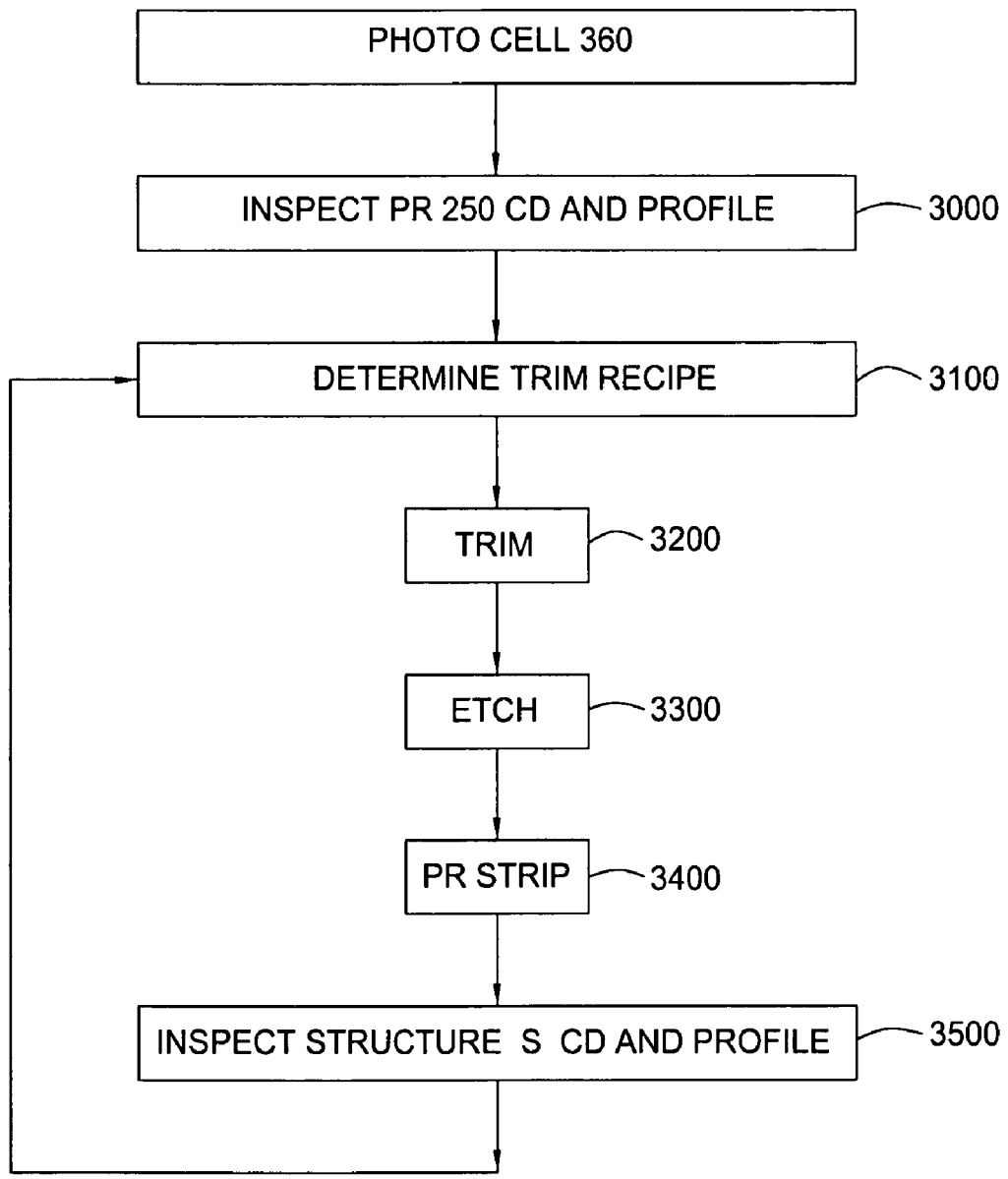
FIG. 3 is a flow chart illustrating sequential steps in a method according to an embodiment of the present invention.

An embodiment of the present invention will now be described in detail with reference to FIGS. 1-3. Referring now to the process flow diagram of FIG. 2, a wafer W to be processed by an etcher comprises a substrate 200 upon which is formed a conductive layer 210, such as polysilicon layer by deposition processing. A patterned photoresist layer 250 (i.e., a photoresist mask formed at photo cell 360) having patterns P is formed on conductive layer 210. An anti-reflective coating (ARC) layer (not shown) may be formed in a conventional manner between conductive layer 210 and photoresist layer 250 to aid the photolithographic process. Alternatively, a silicon nitride layer (not shown) can be formed on conductive layer 210 that is to be patterned to form a "hard mask" by etching using photoresist layer 250. Patterns P have an initial CD referred to as $CD_0$ in FIG. 2. As shown in the flow chart of FIG. 3, wafer W is brought from photo cell 360 to measuring tool 310 at step 3000, where the CD and profile of pattern P are optically measured. The CD and profile measurements are typically taken at several locations (i.e., patterns P) on wafer W. The number of measurements is ultimately limited by the etch process throughput requirements, and influenced by the process' maturity and past performance. Generally, the less mature the process, the greater the number of measurements should be taken. Typically, about five sample measurements are taken including, e.g., top, left, bottom, right and center of the wafer. The CDs and profiles of the measured features can then be averaged before being employed in subsequent steps of the present methodology.

Measuring tool 310 can directly measure CD and profile of certain patterns on photoresist layer 250, such as trenches and the like using conventional optical inspection techniques. For example, a rigorous coupled wave analysis (RCWA) can be performed, wherein a CD corresponding to a given waveform is derived by calculation, such as by a processor in the optical inspection tool. RCWA is discussed in Chateau, "Algorithm for the rigorous couple-wave analysis of grating diffraction", *Journal of the Optical Society of America*, Vol. 11, No. 4 (April 1994) and Moharam, "Stable implementation of the rigorous coupled-wave analysis for surface-relief gratings: enhanced transmittance matrix approach", *Journal of the Optical Society of America*, Vol. 12, No. 3 (May 1995).

The measured CD and profile are used by processor 320 at step 3100 to determine etch process parameters (i.e., a trim recipe) for wafer W, as by an equation that takes into account the CD and profile angle measurements as well as characteristics of etcher 370. Etch process parameters that can be adjusted by processor 320 employing such an equation include etch power, etch time, etch gas flow rate and pressure, magnetic field intensity and magnetic field profile.

To obtain correct final CD and profile, both photoresist trim and underlying layer etch recipes can be adjusted for each wafer. For example, final CD is most affected by the trim recipe, and final profile is most affected by the etch recipe. The relationships between measured pre-etch CD and profile, trim and etch recipes, and final CD and profile are determined empirically prior to the start of production. A series of experiments are conducted by first determining pre-etch CD and profile, then performing trim and etch processes, then mapping the results. For example, a series of experiments changing trim time and etch recipe can be conducted to obtain the best results, and to determine how each of the trim and etch recipes affect the final results. The experimental results can be expressed in algorithms or equations which the processor uses during production to calculate the trim and etch parameters.

Figure 4A:
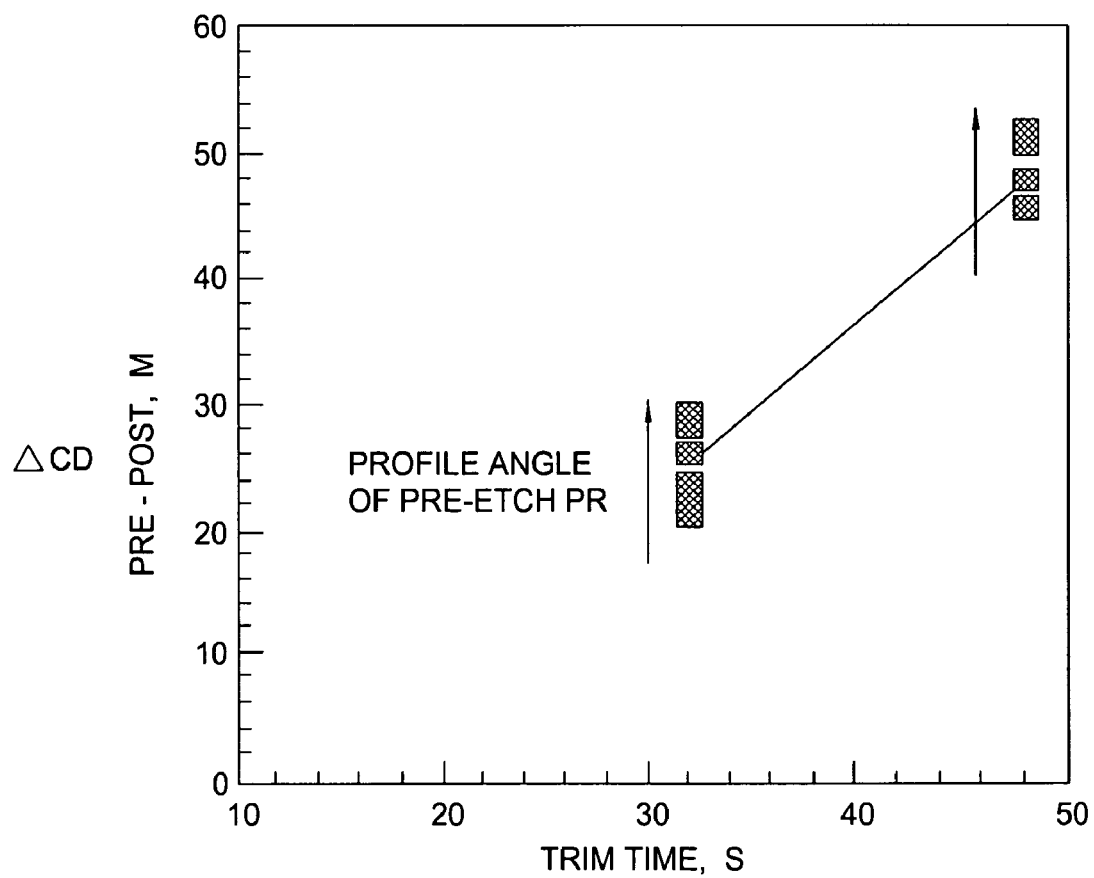
FIGS. 4A-4D are graphical representations of trim process characteristics for use with an embodiment of the present invention.

In one embodiment of the present invention, the photoresist trim time is adjusted while the other parameters of the trim recipe, as well as the etch recipe for the underlying layer, are kept constant. In this embodiment of the present invention, before the integrated OCD/etch process can be performed, a "trim curve" for calculating the trim time must be determined. This involves conducting a design of experiments (DOE) wherein a series of wafers is etched with different trim times, keeping the rest of the trim etch recipe constant. FIG. 4A is an example of a trim curve. The amount trimmed (the difference between pre-etch and post-etch CD) is shown to be a function of both trim time and photoresist (PR) sidewall angle. The dependence of the amount trimmed vs. PR sidewall angle (SWA) is plotted in FIG. 4B. To avoid the complication of within wafer non-uniformity due to etcher and pre-etch non-uniformity, the data are taken from the same die of the series of wafers etched under the same conditions. It can be seen in FIG. 4B that the amount trimmed increases with the SWA. This behavior is intuitively correct, since a re-entrant profile (SWA >90°) is conducive to CD loss in an etch process.

Figure 4B:
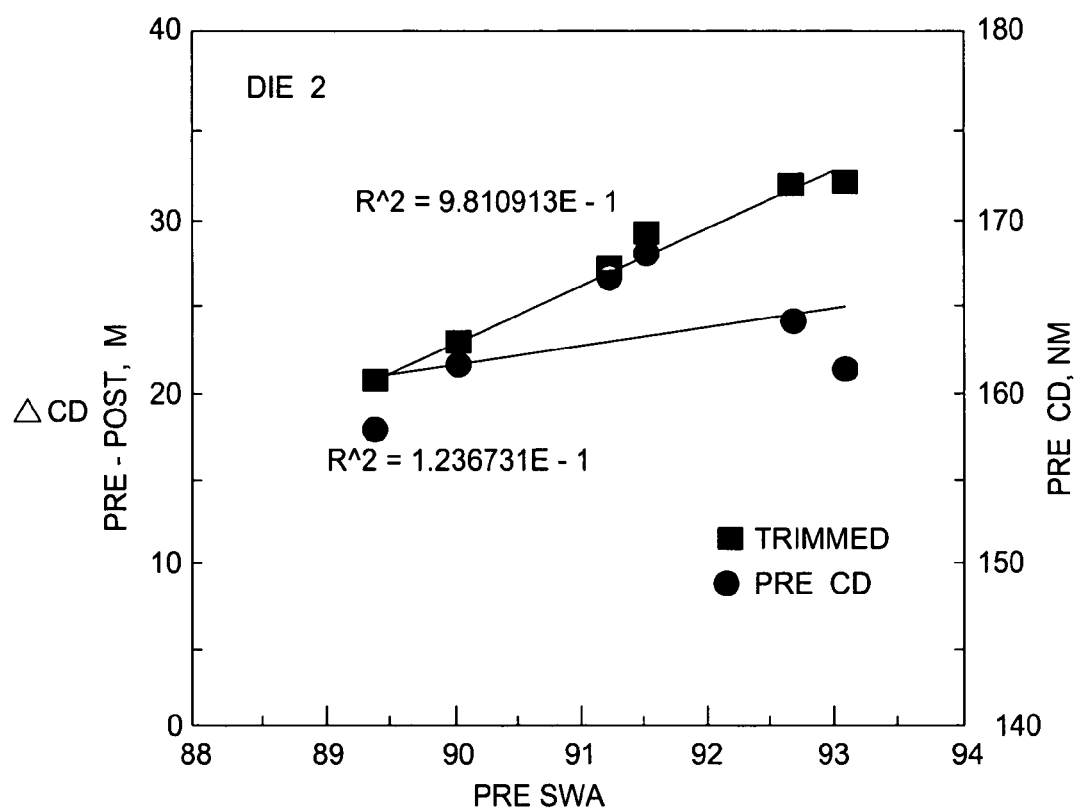
Figure 4C:
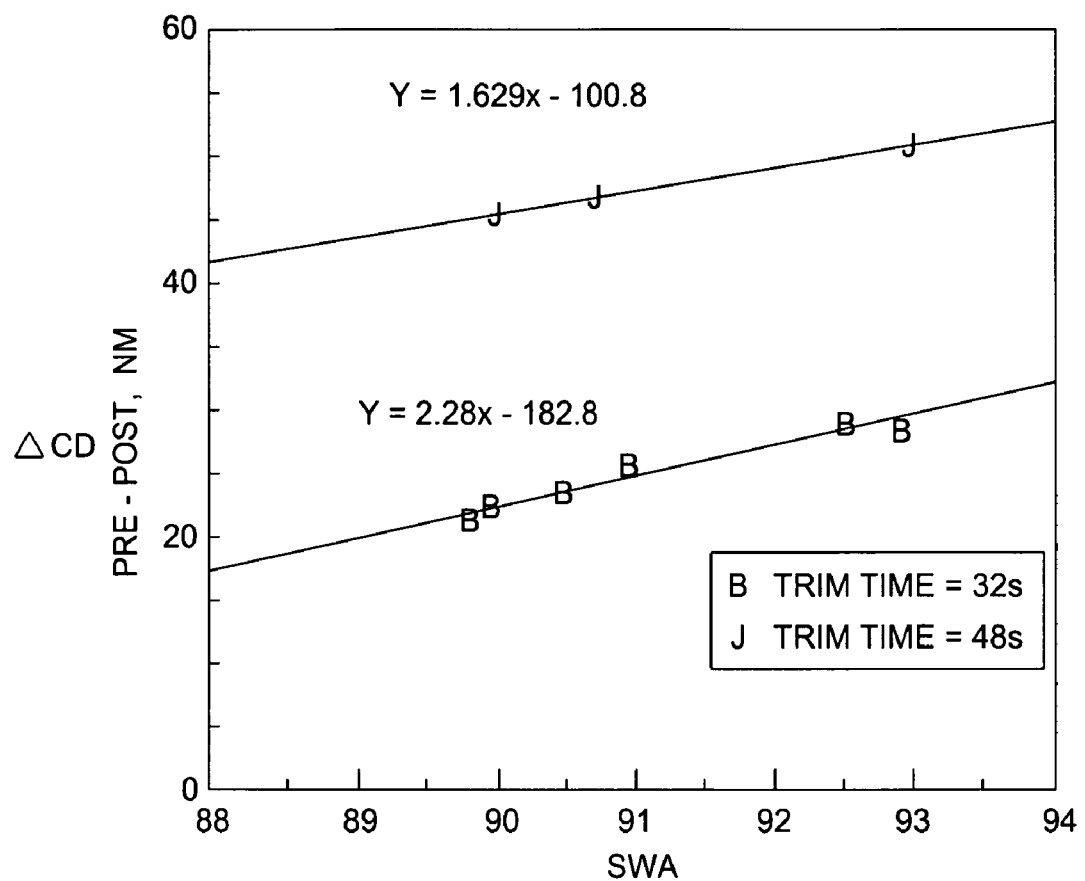

The trim time determination for a given target post-etch CD is illustrated with the trim curve of FIG. 4A plotted as a function of SWA, as shown in FIG. 4C. The dependence of the trim amount on the trim time and sidewall angle can be combined into a single mathematical formula from the two formulas shown in FIG. 4C. If we assume that all responses are linear with time, as shown in FIG. 4C, then the change in CD ("ΔCD") can be expressed in the following equation of a line:

$$\Delta CD = R(A)t + S(A) \tag{1}$$

where t is the trim time and R(A) and S(A) are given by Equations 4 and 5 below. If two trim times for which the trim curve has been determined are referred to as $t_1$ and $t_2$, where $t_2$ is greater than $t_1$, and the sidewall angle is referred to as A, then $$\Delta CDt_2 = R(A)t_2 + S(A) = p_2 A + q_2 \tag{2}$$

and $$\Delta CDt_1 = R(A)t_1 + S(A) = p_1 A + q_1 \tag{3}$$

where p and q are constants obtained from a well-known linear best fit analysis (such constants are shown in the equations in FIG. 4C).

Equations (2) and (3) can be solved for R(A) and S(A) as follows:

$$R(A) = ((p_2 - p_1)A + q_2 - q_1)/(t_2 - t_1) \tag{4}$$

$$S(A) = ((p_1 t_2 - p_2 t_1)A + q_1 t_2 - q_2 t_1)/(t_2 - t_1) \tag{5}$$

Equations (4) and (5) can be substituted into Equation (1) to yield a formula that determines the trim time t necessary to achieve the target post-etch CD for a given pre-etch CD and SWA. This formula is used by processor 320 in step 3100.

Figure 4D:
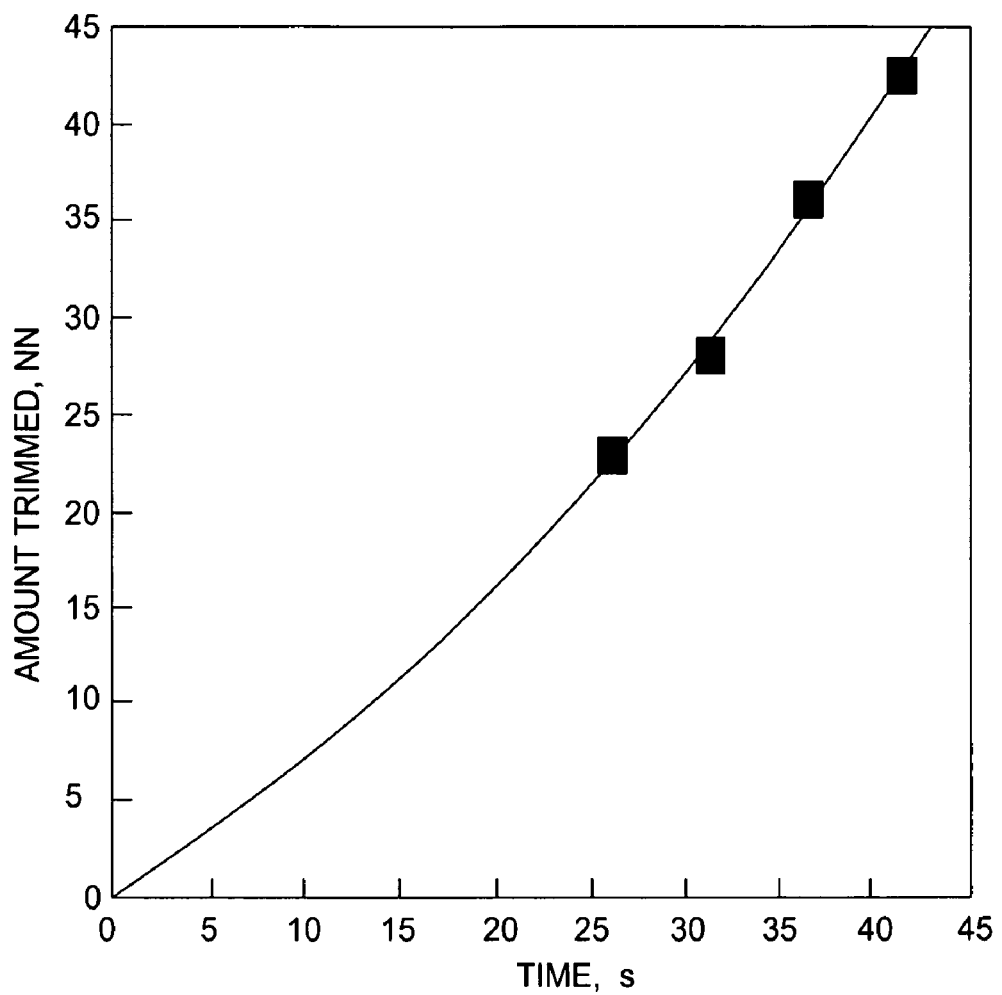

In another embodiment of the present invention, the present methodology also takes into account the fact that trim time versus the amount of photoresist trimmed is non-linear, as shown in FIG. 4D. Thus, the present invention enables more accurate photoresist trimming.

Figure 5A:
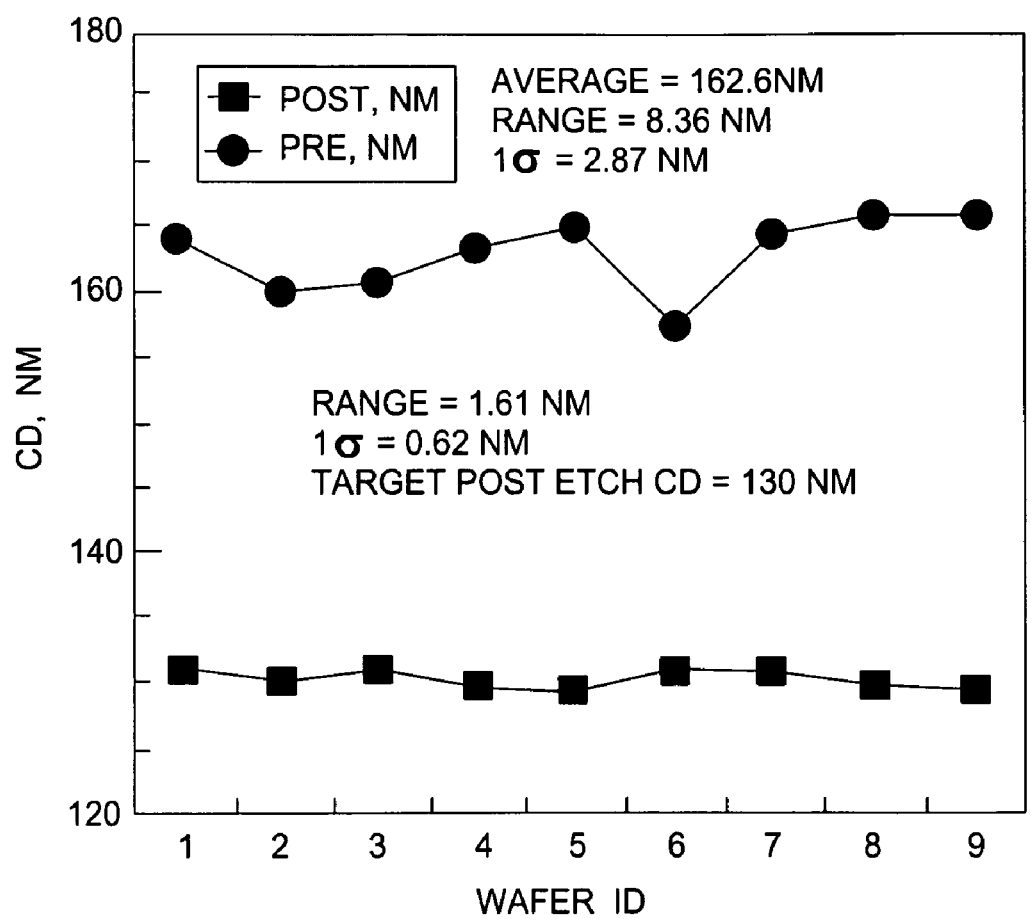
FIGS. 5A-5B are graphical representations of the results of processing wafers using an embodiment of the present invention.

To test the CD control of the methodology of the present invention, a series of wafers was run with a target final CD of 130±1 nm. The average pre-etch CD was 162.6 nm with a full range (maximum-minimum) of 8.36 nm. Nine-point measurements were performed on each wafer, and the average CD and PR SWA for each wafer were fed forward to the etcher. The only change in the entire process sequence was the trim time, which was calculated automatically based on the trim curve information stored in the recipe. FIG. 5A shows the results which indicate that the final post-etch CD distribution is significantly reduced from that of the pre-etch distribution. The full range wafer averaged pre-etch CD decreased from 8.36 nm to a post-etch value of 1.61 nm. The tight control also achieves the final post-etch CD of 130.1 nm, which meets the target range of 130±1 nm.

To obtain these results, it is beneficial to have a very stable etcher, because typically the entire system does not operate on closed loop control. In other words, to be able to use the best known method etch and trim recipes keeping them constant, the etch chamber must first be characterized. For example, the trim curve, shown in FIG. 4A, was determined two days before the wafers used in FIG. 5A were run. The final post-etch CD results indicate excellent etcher stability. In certain embodiments of the present invention discussed below, final CD and profile results can be fed back to processor 320 to adjust the trim curve (and hence trim time) due to drift in the etch step. In this way, lack of long-term etch chamber stability can be taken into account.

Figure 5B:
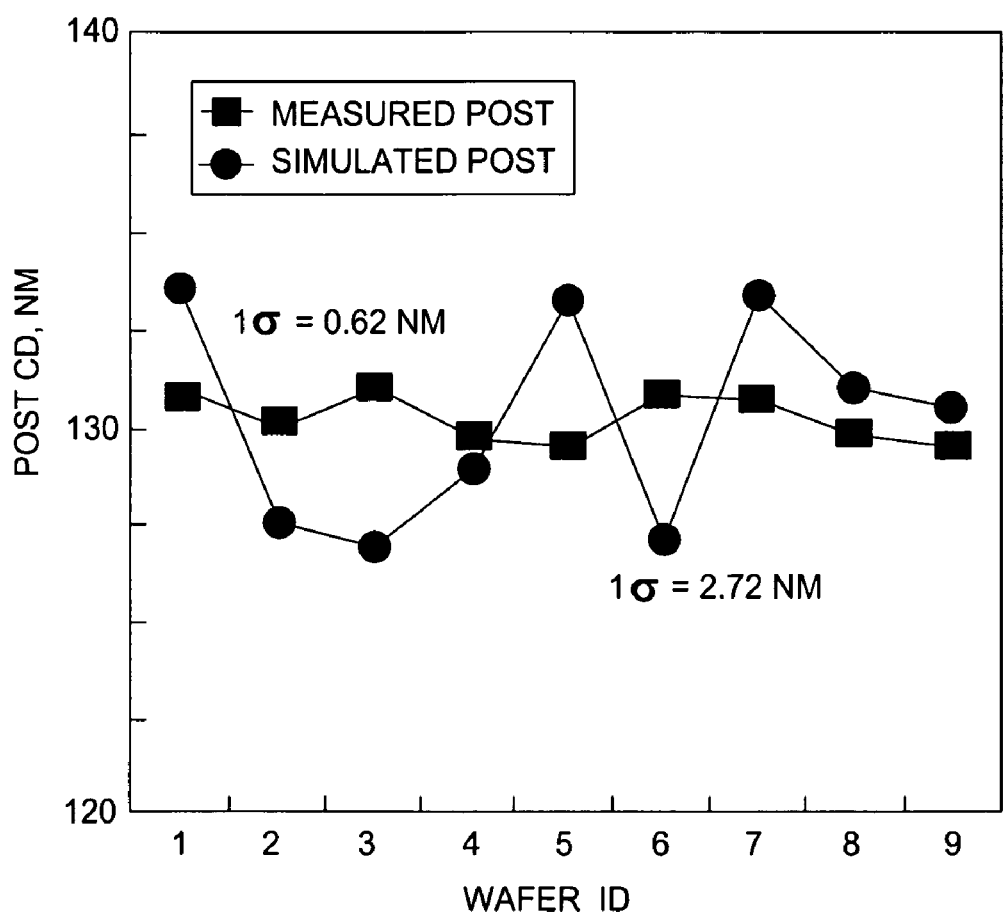

The present invention provides a unique solution to the gate CD control problem that exists today in the semiconductor fabrication industry. It solves this problem by measuring both photoresist CD and profile. The inclusion of the PR profile in the measurement enables, for the first time, a 2nd order correction for the contribution of the PR sidewall angle (the "Theta Transformation"). The importance of the Theta Transformation is shown in FIG. 5B, where the measured post etch CDs obtained with the Theta Transformation are compared with simulated data obtained with only CD correction and no SWA correction. As shown in FIG. 5B, the use of the Theta Transformation tightens the post-etch distribution from 2.72 nm to 0.62 nm.

Referring again to FIG. 3, at step 3200 photoresist layer 250 is etched using the trim recipe (i.e., trim time) determined by processor 320 using the experimentally determined equation. The result is shown at the right side of FIG. 2, wherein patterns P are trimmed to dimension $CD_1$. Underlying layer 210 is then etched, typically at the same etch chamber, in step 3300, resulting in structures S being formed (see bottom right of FIG. 2). Wafer W is thereafter optionally brought to a photoresist ash strip chamber (see step 3400), and brought back to measuring tool 310 at step 3500. The CD and profile of structure S are measured at several locations on wafer W, such as the locations where the pre-etch measurements of photoresist layer 250 were taken at step 3000.

Post-etch CD and profile information is supplied to processor 320, where deviations from target results can be used to adjust the trim and/or etch recipe for the next wafer to be etched. For example, from the measured CD and profile and the previously developed DOE modeling, etcher process drift can be determined; that is, etcher process "age" or where the etcher is on its process timeline. The etch recipe can then be adjusted for the next wafer, so the etch results are closer to the target. Post-etch information can also be fed back to processor 320 to discover and correct for problems in previous processes; for example, if the photoresist on a batch of wafers was baked at the wrong temperature, its trim rate will be different. Thus, if the first etched wafer is measured and this mistake is discovered, the trim time can be adjusted by processor 320 for the rest of the wafers to compensate. Moreover, if the measured dimensional variation is outside predetermined boundaries, or if the processing results change dramatically from one wafer to the next, an alarm can be generated to indicate the etcher should be taken out of service; e.g., for repairs or maintenance.

Although the foregoing embodiment of the present invention adjusts the photoresist trim time while keeping the rest of the trim recipe and the underlying layer etch recipe constant, it should be appreciated that in further embodiments of the present invention, other trim parameters can be variable for each wafer, and the underlying etch recipe can be variable for each wafer. For example, the etch and/or trim recipes can be adjusted to compensate for dense to isolateral CD bias changes from one wafer to the next. Such embodiments require an appropriate DOE to develop the proper equations for use by processor 320 to choose the trim/etch process parameter values.

It should also be appreciated that the present methodology of adjusting an etch recipe based on measured CD and profile is not limited to the photoresist trim process. It can also be employed when a photoresist trim is not performed. Since post-etch profile is dependent on photoresist profile, the post-etch profile of any etched pattern can be fine-tuned based on the measured photoresist profile sidewall angle using the present methodology.

In further embodiments of the present invention, an apparatus for processing a semiconductor wafer is provided wherein a wafer is removed from a wafer cassette, and a CD and profile of a pattern on a patterned layer formed on the wafer is measured using an optical measuring tool. A process, such as an etch process, is then performed on the wafer using a set of process parameter values, such as a trim or etch recipe, selected based on the pattern CD and profile measurements. Post-etch processing, such as ash stripping and wet cleaning, are optionally performed by the apparatus, then a CD and profile of a structure formed in the underlying layer by the etch process are measured at several locations before the wafer is returned to a cassette. The post-etch measurements are fed back to the etcher to adjust the etch recipe for a subsequent wafer. All of the transfer and processing steps performed by the apparatus are performed in a clean environment, thereby increasing yield by avoiding exposing the wafer to the atmosphere and possible contamination between steps.

These embodiments of the present invention provide for pre-etch CD and profile measurements of every wafer and adjustment of the photoresist trim/etch recipe for every wafer according to its CD and profile measurements to correct for process variations in previously visited tools, such as deposition uniformity variations at a deposition module and/or exposure and focus variations at a photo cell. The present invention also provides for etch recipe adjustment for etcher process drift.

An apparatus for processing a semiconductor wafer according to an embodiment of the present invention will now be described with reference to FIG. 6A. The apparatus comprises a chamber or "mainframe" 901, such as the Centura™ processing system, available from Applied Materials of Santa Clara, Calif., for mounting a plurality of processing chambers, e.g., conventional etch processors 902, such as DSPII™ polysilicon etch chambers available from Applied Materials of Santa Clara, Calif., and one or more transfer chambers 903, also called "load locks". In one embodiment of the present invention, four etch processors 902 are mounted to mainframe 901. In one exemplary embodiment, three etchers 902 are used for etching, and one is optionally used for post-etch cleaning (i.e., removing photoresist polymers and other residue from wafers after etching). Mainframe 901 is capable of maintaining a vacuum environment in its interior. A robot 904 is provided for transferring wafers between processing chambers 902 and transfer chambers 903.

Transfer chambers 903 are connected to a factory interface 905, also known as a "mini environment", which maintains a controlled environment. A measurement tool 906, such as an optical measurement tool utilizing scatterometry or reflectometry techniques, is mounted inside factory interface 905. An example of a tool that can be used as measurement tool 906 is measuring tool 310 described above (see FIG. 1), which can include the measurement tool described in U.S. Pat. No. 5,963,329. A processor (i.e., a processor corresponding to processor 320) to provide etcher 902 an etch recipe based on the wafer CD and profile measurements as described above can be part of etcher 902 or mainframe 901. One or more robots 907, or a track robot, are also mounted inside factory interface 905 for transferring wafers between transfer chambers 903, measurement tool 906 and standard wafer cassettes 908 removably attached to factory interface 905. Mainframe 901, transfer chambers 903, factory interface 905 and robots 904, 907 are all parts of a conventional processing system such as the Applied Materials Centura™, and communicate with each other while maintaining a clean, controlled environment. Such conventional processing systems further comprise a processor, such as a computer (not shown) to electronically control the operation of the system, including the transfer of wafers from one part of the system to another.

Figure 7:
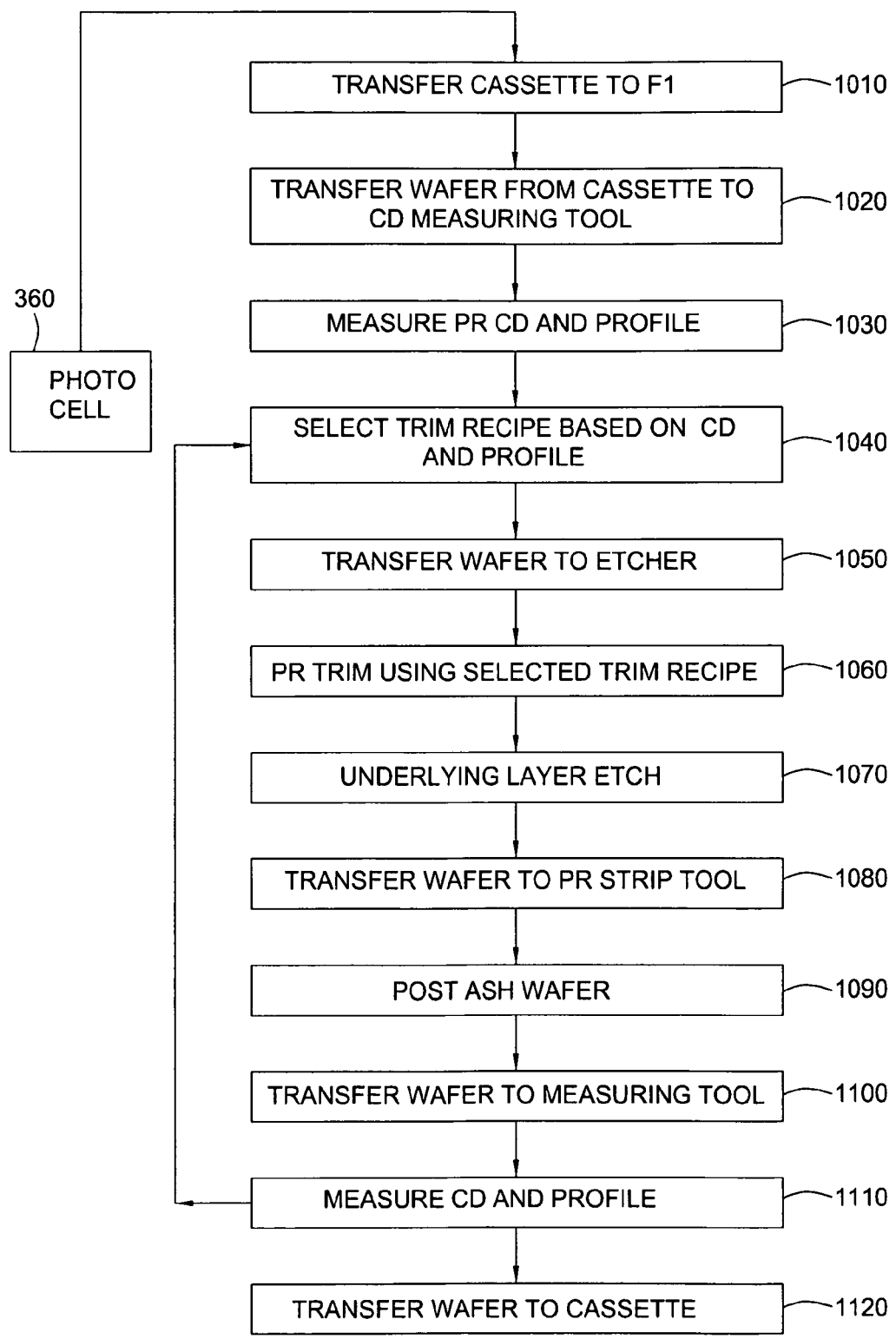
FIG. 7 is a flow chart illustrating sequential steps in a method according to an embodiment of the present invention.

The operation of the apparatus according to this embodiment of the present invention will now be described with reference to the flow chart of FIG. 7. After a plurality of wafers are processed at a processing tool, such as a photo cell as described above, to form a photoresist mask on an underlying layer, they are loaded into a cassette 908, and the cassette is transferred to factory interface 905 at step 1010. A wafer is then unloaded from cassette 908 and transferred to measurement tool 906 by robot 907 (step 1020), and the CD and profile of a pattern on the photoresist are measured at step 1030. At step 1040, a photoresist trim recipe for the wafer is selected based on the CD and profile measurements, as explained above.

At step 1050, the wafer is transferred from measurement tool 906 to etcher 902 using robot 907 to move the wafer to transfer chamber 903, and using robot 904 to move the wafer to etcher 902. The photoresist layer is trimmed (step 1060), the wafer is then etched (step 1070), typically in the same etcher 902. Next, in certain embodiments of the present invention, the wafer is transferred to a photoresist stripping chamber 902 (step 1080), such as a conventional ash strip chamber, for removal of the photoresist (step 1090). The wafer is then transferred back to measurement tool 906 for a post-etch CD and profile measurement (steps 1100 and 1110) before being loaded into cassette 908 at step 1120. The post-etch CD and profile measurements are sent to processor 320, and used to correct the trim curve and/or etch recipe for the next wafer to be etched, as explained above.

Figure 6A:
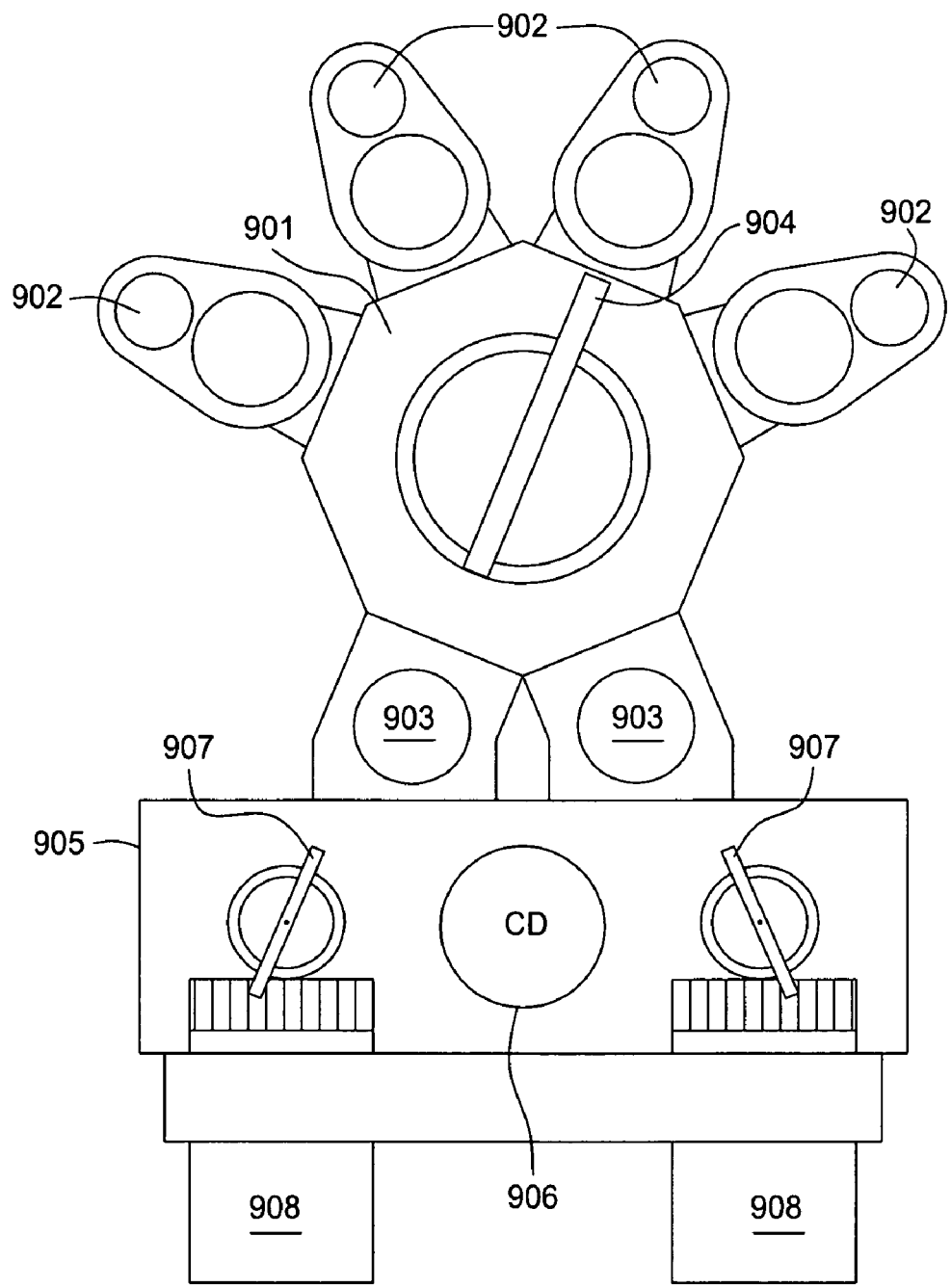
FIGS. 6A-6E schematically illustrate processing modules according to embodiments of the present invention.
Figure 6B:
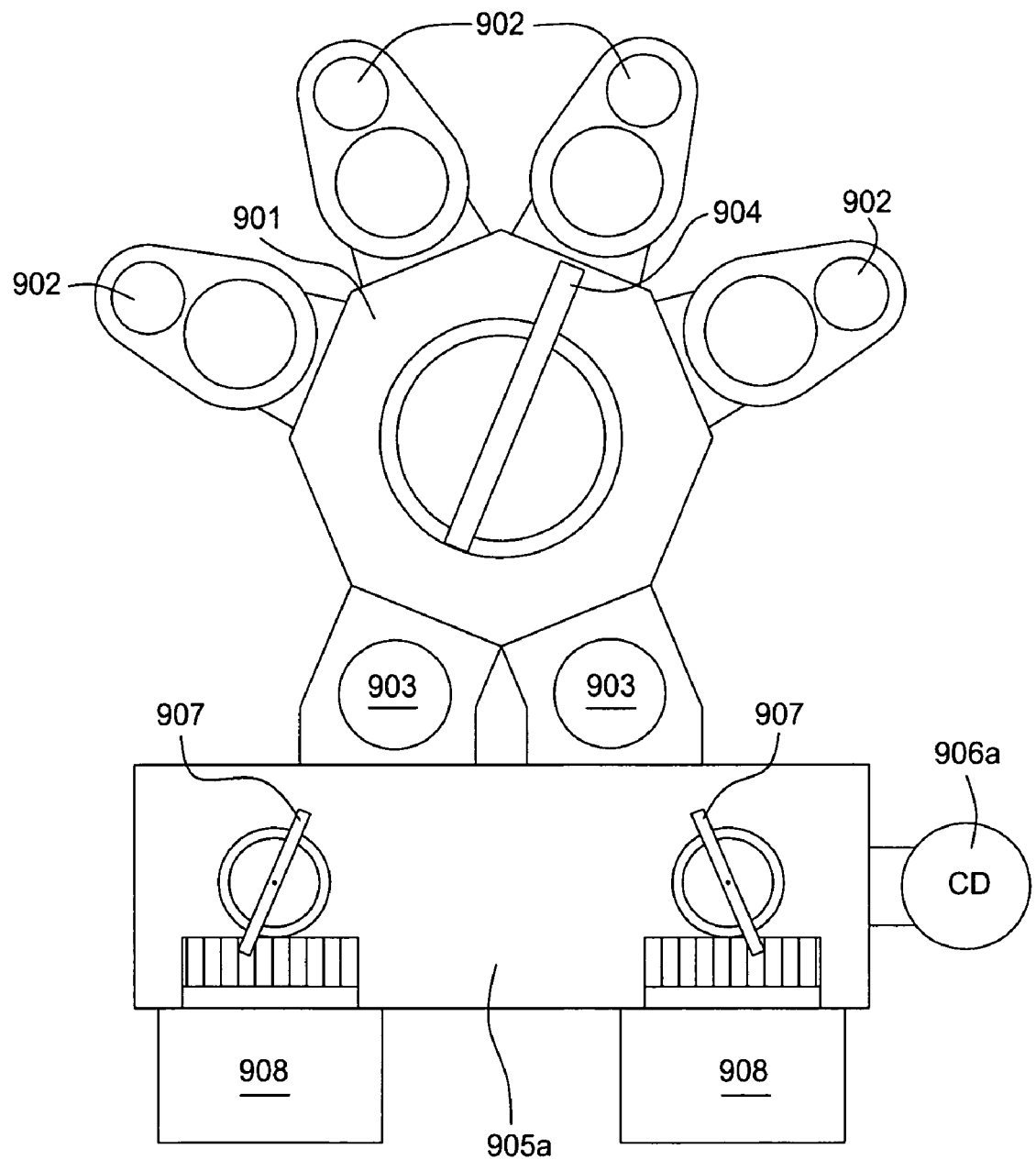

In a further embodiment of the present invention shown in FIG. 6B, factory interface 905a has a CD measurement tool 906a mounted to it (instead of inside it as in the embodiment of FIG. 6A). The apparatus of FIG. 6B operates according to the flow chart of FIG. 7 as described above.

Figure 6C:
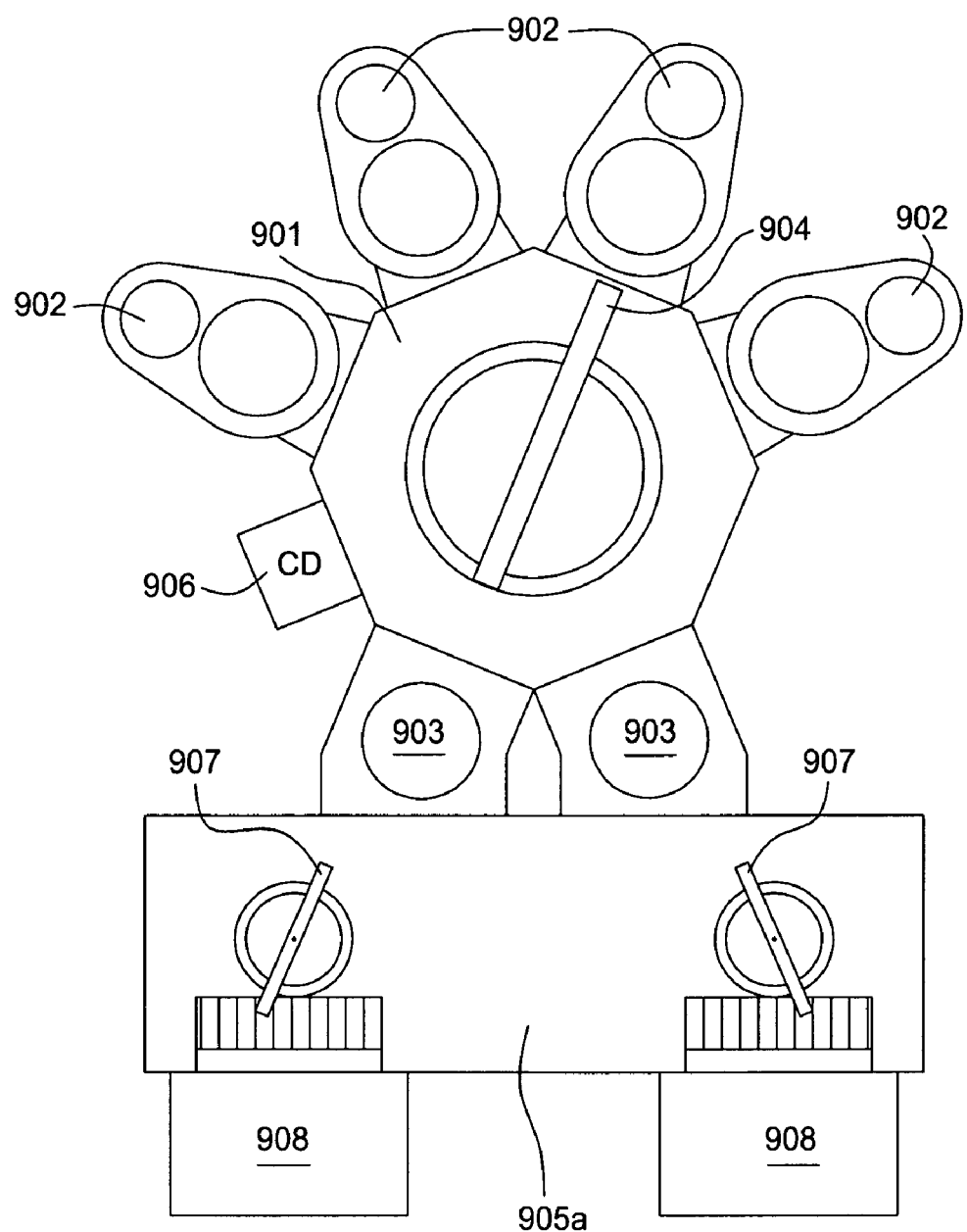

In a still further embodiment of the present invention illustrated in FIG. 6C, measurement tool 906a is mounted on mainframe 901 rather than factory interface 905a. The apparatus of FIG. 6C operates according to the flow chart of FIG. 7 as described above.

Figure 6D:
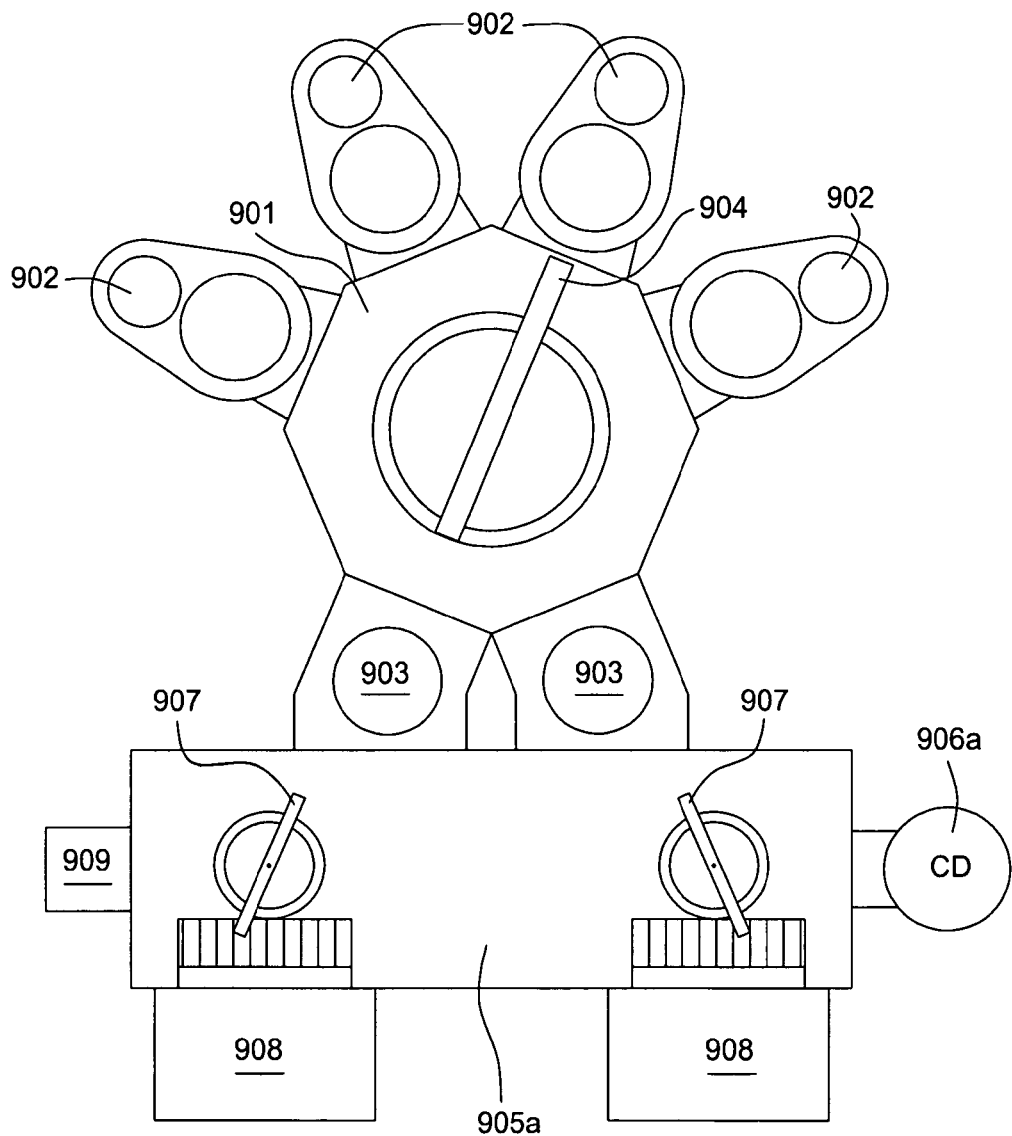

In another embodiment of the present invention illustrated in FIG. 6D, factory interface 905b has a measurement tool 906A and a conventional wet clean chamber 909 mounted to it. Wet clean chamber 909 can be a single wafer cleaning station using ultrasonic transducers. One of the chambers 902 on mainframe 901 is a conventional ash strip chamber, as discussed above. After a wafer is etched, it is transferred to ash strip chamber 902 for photoresist removal (steps 1080 and 1090 of FIG. 7), then it is transferred to wet clean chamber 909 and cleaned prior to or after being transferred to measurement tool 906A in step 1100.

Figure 6E:
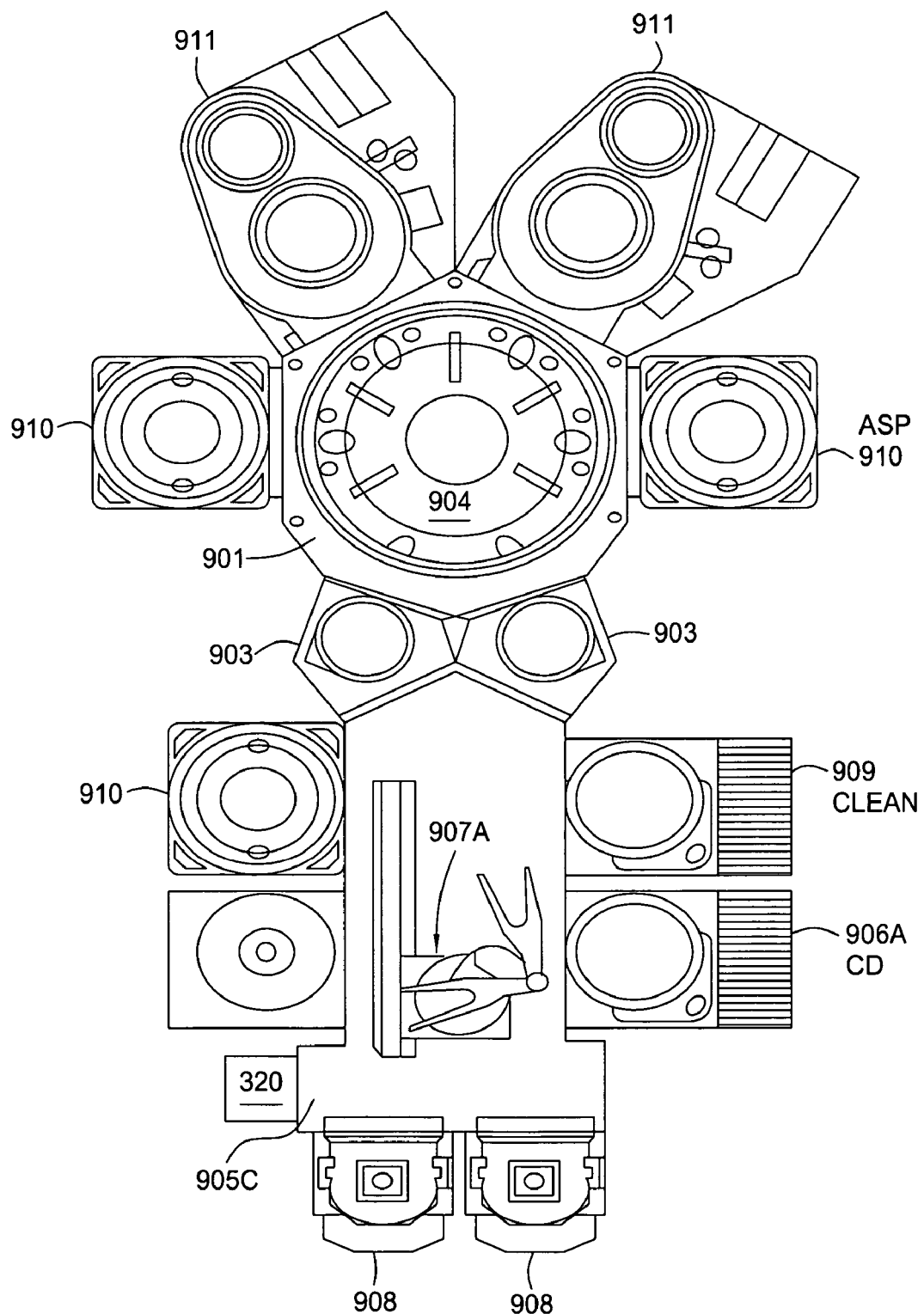

In another embodiment of the present invention illustrated in FIG. 6E and fully described in U.S. patent application Ser. No. 09/945,454, filed Aug. 31, 2000, mainframe 901 is the Applied Materials' Centura™ and factory interface 905C is the Link™, also available from Applied Materials. Factory interface 905C has a single robot 907A, a measurement tool 906A as described above, a conventional wet clean chamber 909 as described above, and a conventional ash strip chamber 910 mounted to it. Additionally, two of the ash strip chambers 910 are mounted on mainframe 901, along with two conventional etchers 911. Alternatively, four etchers 911 can be mounted to mainframe 901 instead of ash strip chambers 910. After a wafer is etched, it is transferred to one of the ash strip chambers 910 for photoresist removal (steps 1080 and 1090 of FIG. 7), then it is transferred to wet clean chamber 909 and cleaned prior to or after being transferred to measurement tool 906A in step 1100.

The embodiments of the present invention illustrated in FIGS. 6A-E provide pre-etch CD, and profile measurement, etching, cleaning, and post-etch CD measurement entirely under controlled environmental conditions. By providing etching, cleaning and measurement tools on the mainframe and/or factory interface, the wafer can be etched, cleaned and inspected before being returned to a cassette, thereby reducing processing time and cost. Moreover, the embodiments of FIGS. 6A-D provide feedback and feed forward of measurement data in real time for every wafer, thereby enabling etch processing to be customized for every wafer to increase yield. Thus, the present invention provides increases in yield and decreases in production costs vis-à-vis prior art systems, wherein feedback from CD measurements, if any, is on a lot-to-lot basis rather than for every wafer, and wafers must be exposed to the atmosphere between measuring, etching and cleaning steps.

The present invention is applicable to the manufacture of various types of semiconductor devices, particularly high density semiconductor devices having a design rule of about 0.18μ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

In another embodiment of the invention, a duration T (i.e., trim time T) of the trimming process is calculated for each product wafer to compensate for a plurality of parameters and manufacturing variables that are apparent on pre-etched substrates. The trim time is calculated as a numerical solution, or "N-parameter critical dimension (CD) control graph", of a mathematical equation, wherein N is a number of parameters and manufacturing variables taken into account in calculations of the trim time T. The parameters of the trim recipe, as well as parameters of the process recipe used for etching a material layer beneath the patterned mask are kept constant during such trimming and etch processes.

The numerical solution is based on sets of pre-trim measurements and post-etch measurements that are performed upon test substrates prior to trimming and etching the product substrates. Based on these sets of measurements, an empirical model N-parameter CD control graph is generated which precisely describes how the etch process results for the product substrates can be predicted. The measurements performed on the test and product wafers are generally non-destructive measurements (e.g., optical non-destructive measurements) that are performed for a statistically sufficient number of regions (e.g., 5-9 regions) on a wafer and then averaged to compensate for non-uniformity of the measured parameter within the wafer. Such measurements may generally be performed using measuring tools which are components of a semiconductor wafer processing system (discussed in reference to FIGS. 6A-6E above). In an alternate embodiment, stand-alone measuring tools may also be used to inspect the wafers.

Advanced process control techniques may be applied to semiconductor manufacturing processes. These techniques may be applied to gate level critical dimension (CD) control, although they can be applied to most semiconductor manufacturing processes. The primary goal of process control in manufacturing is to maintain the process output to be within the lower and upper specification limits (LSL and USL). There is an input and output for every process tool. For most process tools, the outputs are correlated to their respective inputs and for all process tools the outputs are effected by the process tool condition.

Figure 9A:
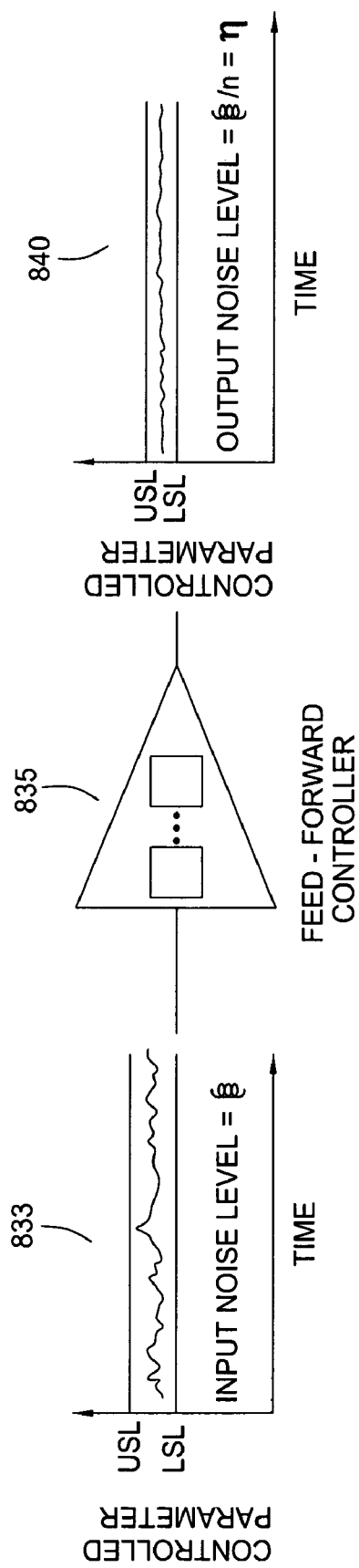
FIGS. 9A and 9B illustrate the function of a feed-forward controller.

The controlled parameter of the input and output of each process tool can be modeled as an average value with a finite noise level superimposed on it. Due to the finite resolution of each process tool, each tool "adds" noise to the input objects. As a result, the noise level at the output is expected to be higher than at the input. This noise reduction proposition has been applied to gate-level etch CD control. In such application, the controlled parameter is the gate CD and the noise that is of interest at the output is the wafer to wafer CD repeatability. By measuring the CD of the incoming wafers and feed-forwarding this measured quantity to the etcher, the etcher can then use this information to adjust the etch recipe so that the wafer-to-wafer CD distribution at the output (FIG. 9A graph 840) is better than the input (FIG. 9A graph 833). This noise reduction filter behavior of the feedforward controller 835 is illustrated in FIG. 9A.

Figure 9B:
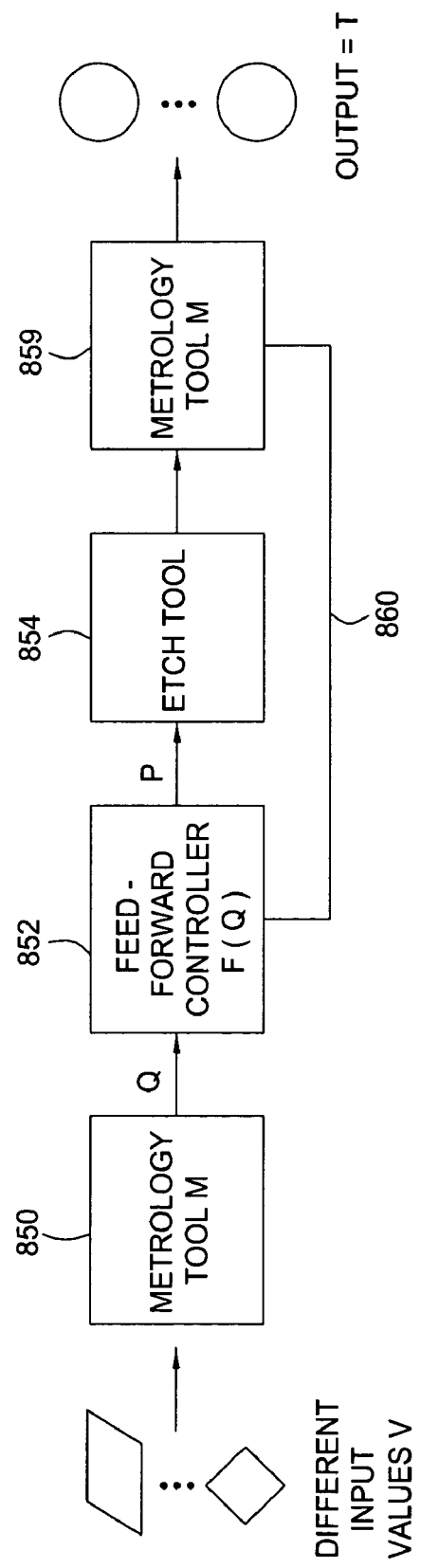

In order for this control technique to work, the resolution of the controller 835, including its functional blocks, has to be significantly smaller than the input noise level. The functional blocks of the controller 835 are depicted in FIG. 9B. The entire process starts with an automatic measurement performed at the input. The measurement can be done either by an integrated or stand-alone metrology tool 850. The results of this measurement, Q, are fed-forward to a controller 852. The controller 852 has a built-in etch process model that accurately predicts the outcome of the etch process tool based on Q. The controller 852 produces the necessary process condition P to an etcher 854 (etch tool). The result is that the outputs of the etcher quantified as T with a noise component η which is significantly smaller than that of the input noise level. Further enhancement in noise reduction is achieved by using a second metrology tool 859 to measure output parameters and feed the parameters back along path 860 to the controller 852.

The noise component η is a measure of the resolution of the entire system including not only the resolution of the metrology tool 850 and the process tool (etcher 854) but also the second metrology tool 859 used to quantify the results at the output. In principle, this feed-forward controller 852 is sufficient to control the output to be within the USL and LSL (graphs 533 and 540 shown in FIG. 9A). Further enhancement in noise reduction is achieved by using a second metrology tool 859 to measure output parameters and feed the parameters back along path to the controller 852.

The N-parameter CD control graph defines the trim time T for each product wafer as a multi-parameter function of a plurality of parameters associated with the patterned mask to be trimmed and an underlying layer to be etched using the trimmed mask as an etch mask. Generally, such parameters include an amount of the mask material (e.g., photoresist) to be removed (i.e., trimmed), a sidewall angle (SWA) of a trimmed element of the patterned mask, width of a foot of such an element, thickness of the patterned mask, thickness of the material layer beneath the patterned mask, and the like.

The CD control graph can be written mathematically as follows:

$$\Delta CD = CD_{pre} - CD_{post} = R(t, Q_1, Q_2, \ldots, Q_N) \quad (6a)$$

where R is the response function of the etch tool, t is the trim time, and $Q_i$, is the ith pre-etch measured parameter fed forward from the measurement tool. $CD_{post}$ in this case is the target CD, T. Since t is the only unknown in Eq. (6a), it can solved by solving Eq. (6a).

In another embodiment, the trim process condition can be a variable. In this case the CD control graph takes the following fork:

$$\Delta CD = CD_{pre} - CD_{post} = R(P, Q_1, Q_2, \ldots, Q_N) \quad (6b)$$

where P is a trim process parameter. P can be one of gas flow rate, pressure, rf power, and the like. In this case P will be the solution of the control graph.

The amount of the photoresist to be trimmed is defined herein as a difference between widths of the pre-trimmed element (e.g., line, column, space between the lines or columns, and the like) of the patterned mask and the post-trim target width of such an element of the mask. Correspondingly, the term "sidewall angle" is used in reference to the angle formed between a sidewall of the pre-trimmed element of the patterned mask and a surface of the underlying layer, and the term "foot" is used in reference to the form factor of a bottom portion of the pre-trimmed element, respectively. The sidewall angle and foot of the element of the patterned mask are defined in a cross-sectional view of the mask. The trimming process is generally an isotropic etch process (e.g., isotropic plasma etch process) that is performed upon a patterned mask to reduce width of the features of such a mask.

The N-parameter CD control graph may compensate for variables associated with the etch process that uses the trimmed mask as the etch mask, as well as for variables associated with the etch reactor performing such an etch process.

In one embodiment, a group of the test wafers that are trimmed using the pre-defined N-parameter CD control graph (i.e., each such wafer trimmed for the calculated trim time T) is then etched in the etch reactor. After the etch process, critical dimensions (e.g., width) of the etched features are measured and compared with the target values for such dimensions. Then, the N-parameter CD control graph is modified such that the features of the patterned mask on the product wafers are trimmed to the pre-determined width (i.e., for the modified trim time T) thereby facilitating, during the etch process, etching the features having the pre-determined (i.e., target) critical dimensions (CDs).

Figure 8A:
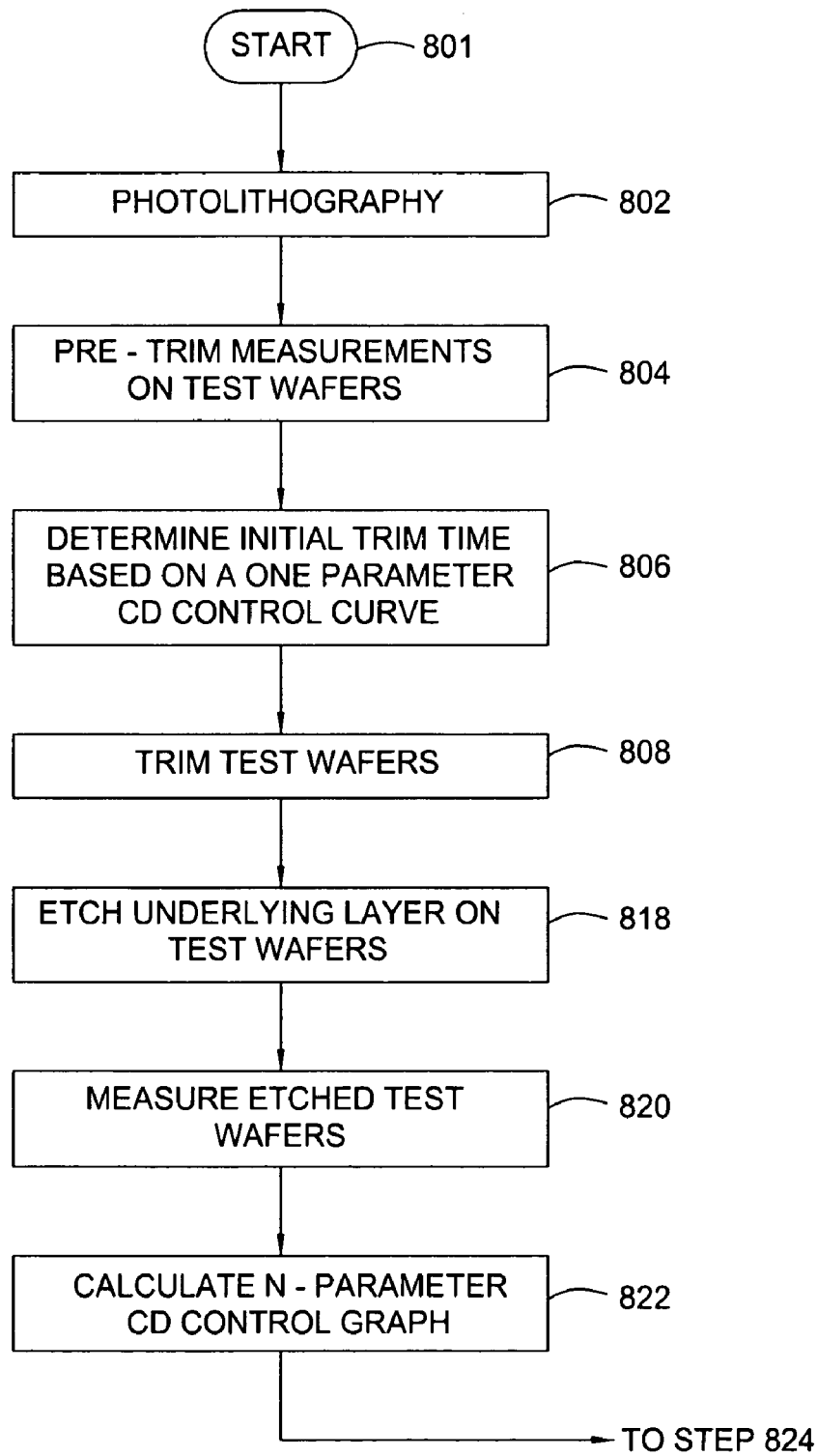
FIGS. 8A-8B depict flow diagrams of methods for generating an N-parameter critical dimension (CD) control graph and for running production wafers with feed forward.
Figure 8B:
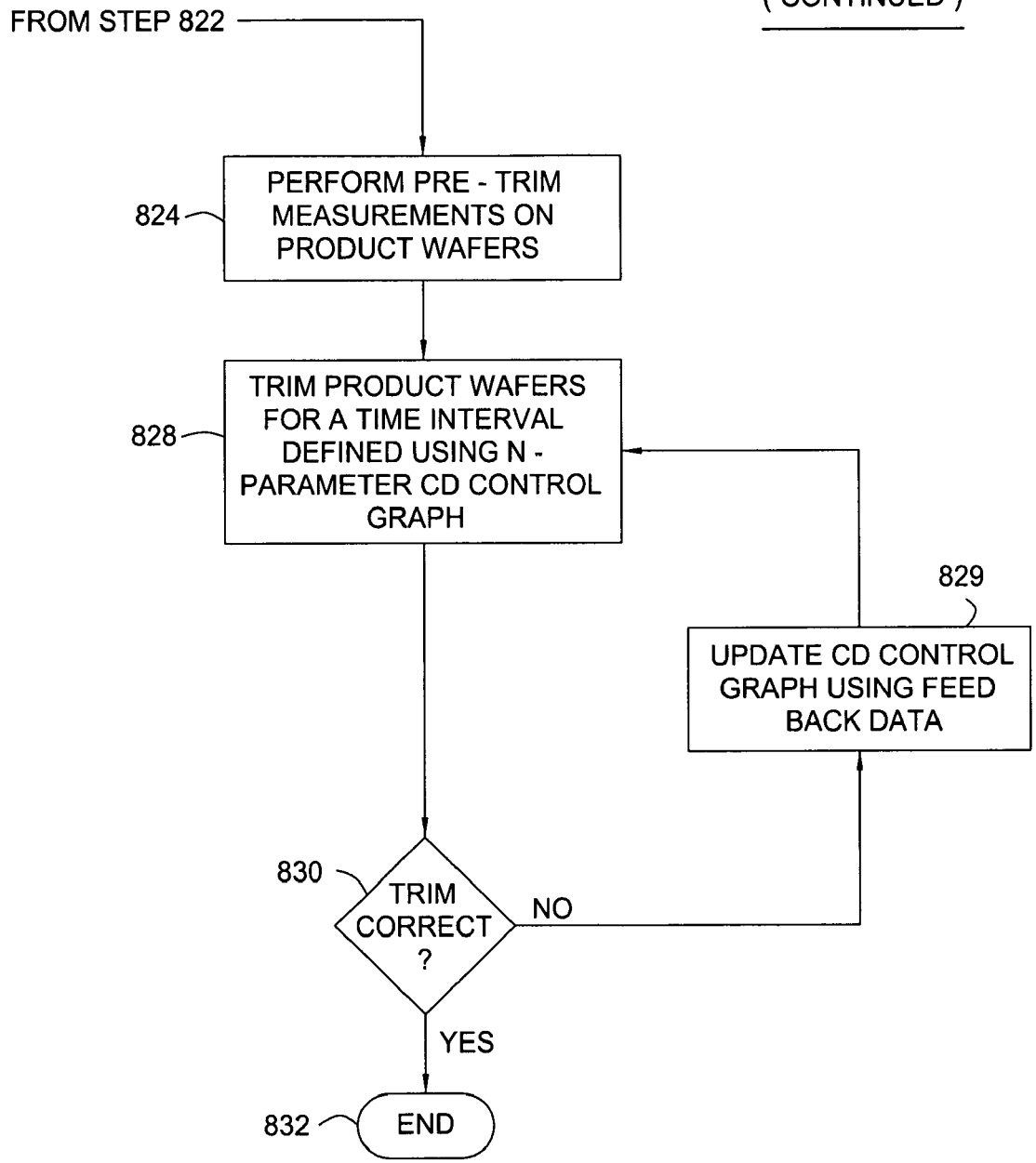

FIGS. 8A-8B depict a flow diagram of a method of calculating the trim time T or trim process condition in accordance with one embodiment of the present invention as a sequence 800. The sequence 800 comprises processing steps that are performed on the test and product substrates during the trim and post-trim etch processes. In FIGS. 8A-8B, numerals in parenthesis designate the links that interconnect portions of the flow diagram depicted in FIG. 8A and FIG. 8B, respectively.

The sequence 800 starts at step 801 and proceeds to step 802 when a patterned mask (e.g., photoresist patterned mask) is formed on an underlying layer or layers that are deposited on a semiconductor substrate, such as silicon (Si) wafer, and the like. The underlying layer may also comprise a top film of an anti-reflective coating (ARC). In one application, the underlying layers comprise a gate electrode layer (e.g., polysilicon layer) and gate dielectric layer of a gate structure of a field effect transistor (e.g., complementary metal-oxide-semiconductor (CMOS) field effect transistor, and the like).

In one application discussed herein, the patterned mask is a photoresist patterned mask, or photoresist mask. The photoresist mask is generally formed using a photolithographic process. Due to optical limitations of the photolithographic process, the photoresist mask generally comprises elements that represent scaled-up replicas of the features to be etched in the underlying layer or layers. As such, after the photolithographic process, the photoresist mask should be trimmed before such a mask may be used as an etch mask.

In an alternate application, the patterned mask may be formed from other materials, e.g., amorphous carbon (i.e., α-carbon), Advanced Patterning Film™ (APF) available from Applied Materials, Inc. of Santa Clara, and the like. Such masks are generally fabricated using sacrificial photoresist masks and, as such, also should be trimmed before used as the etch masks.

At step 804, pre-trim measurements are performed on test wafers. The test wafers generally comprise the patterned mask and underlying layer that are substantially similar to such of the product wafers. The pre-trim measurements generally comprise measurements of parameters selected, in a specific application, for an N-parameter CD control graph. Depending on the application, different combinations of parameters of the patterned mask and the underlying layer may be selected for the N-parameter CD control graph based on a degree of their contribution to yield of the trimming and etch processes.

Generally, the parameters associated with the element (or elements) of the patterned mask having smallest width (i.e., elements having critical dimensions) are selected for use in calculations of the trim time T. Herein such elements of the patterned mask are referred to as critical elements.

In one exemplary embodiment, the trim time T is calculated as a function of one parameter, i.e., N=1. Such parameter may be for example, e.g., pre-trim width and sidewall angle of the critical element of the patterned mask, thickness of the underlying layer or, alternatively, width of the foot of such a critical element. It is believed that one such parameter has most impact on accuracy of calculating the trim time T in applications, such as etching a gate electrode of a gate structure of a CMOS transistor, and the like.

Thickness of the underlying layer defines a duration of the etch process. The etch process has a finite directionality and, as such, material forming the sidewalls of the etched feature, as well the material of the etch mask are consumed as the etch process progresses. Therefore, to compensate for such losses during the etch process, the etch process may use an etch mask having an initial width (i.e., post-trimmed width) that is greater than the target width of the etched feature.

In alternate embodiments, a number of parameters of the patterned mask used to calculate the trim time T may be greater than 1. However, in such an embodiments, the trim time T may be calculated using the same methodology as in the described below embodiment having N=1.

At step 806, a trim time for the test wafers is selected. The test wafers are trimmed for a specific pre-determined time that is selected within a time interval between the anticipated maximal and minimal duration of the trimming process when such a process is performed on the product wafers.

At step 808, the patterned masks of the test wafers are trimmed for the pre-defined time (discussed in reference to step 806 above). Step 808 generally uses same trimming recipe that is used to trim the patterned masks of the product wafers.

At step 818, the test wafers are etched using the trimmed patterned masks as etch masks. Step 818 generally uses same process recipe that is used to etch the product wafers. The wafers may be trimmed and etched either in separate reactors or in the same etch reactor, such as the Decoupled Plasma Source (DPS) II module of CENTURA® semiconductor wafer processing system available from Applied Materials, Inc. of Santa Clara, Calif. After the etch process, the photoresist mask may be optionally stripped using, for example, the Advanced Strip and Passivation (ASP) module or AXIOM® module of the CENTURA® system.

At step 820, the test wafers undergo the post-etch measurement of the width (i.e., critical dimension) of the features etched in the underlying layer during step 818. In one exemplary embodiment, the post-etch measurements comprise measurements of the width of the polysilicon gate electrode of a gate structure of the CMOS transistor. Such post-etch measurements may generally be performed using the same measuring tools that are employed for the pre-trim measurements (discussed in reference to step 804 above).

At step 822, the N-parameter CD control graph is defined using the results of measurements performed during steps 804 and 820. Assuming that the etch rate during a trimming process does not depend on the absolute value of a measured parameter, the equation for ΔCD may be expressed using the following mathematical formula for the 3-parameter CD control graph:

$$\Delta CD = C_{PRE} - C_{TARGET} = f + t_1 T + t_2 T^2 + a_1 A + a_2 A^2 + x_1 AT + b_1 B + b_2 B^2 + x_2 BT + x_3 AB + x_4 ABT, \quad (7)$$

where T is the process time (i.e., trim time) of the trimming process, $C_{PRE}$ is a pre-trim width (the first measured parameter) of a critical element of the patterned mask, $C_{TARGET}$ is a target (i.e., post-trim) width of the critical element, ΔCD is a difference between the pre-trimmed width and the target width, A is a second measured parameter (e.g., sidewall angle), B is a third measured parameter (e.g., thickness of the underlying layer to be etched), and the $f$, $t_1$, $t_2$, $a_1$, $a_2$, $x_1$, $x_2$, $x_3$, and $x_4$ are coefficients of the CD control graph. These coefficients are obtained by building a statistical model that best fit to the measured data.

The equation (7) may be generalized in the following form:

$$n + mT + t_2 T_2 T^2 = 0 \quad (8)$$

where $$n = f + a_1 A + a_2 A^2 + b_1 B + b_2 B^2 + x_3 AB - C_{PRE} + C_{TARGET} \quad (9)$$

$$m = f + x_1 AT + x_2 BT + x_4 ABT. \quad (10)$$

The equation (8) may be further solved for the trim time T:

$$T = -n/m, \text{ if } t_2 = 0; \quad (11)$$

$$T = ((m^2 - 4t_2 n)^{1/2} - m)/(2t_2), \text{ if } t_2 \neq 0. \quad (12)$$

For the 3-parameter CD control graph, the coefficients in equation (8) are defined by the following expressions:

$$n = f + a_1 A + a_2 A^2 + b_1 B + b_2 B^2 + x_3 AB - C_{PRE} + C_{TARGET} \quad (13)$$

$$m = t_1 + x_1 x_1 AT + x_2 B + x_4 AB. \quad (14)$$

For the 2-parameter CD control graph when B=0, the coefficients in equation (7) are defined by the following expressions:

$$n = f + a_1 A + a_2 A^2 - C_{PRE} + C_{TARGET} \quad (15)$$

$$m = t_1 + x_1 AT \quad (16)$$

Correspondingly, for the 1-parameter CD control graph when A=B=0, the coefficients in equation (8) are defined by the expressions: $n = f - C_{PRE} + C_{TARGET}$, $m = t_1$, and $t_2 = 0$.

Calculations solving the equation (8) define the N-parameter CD control graph. Such calculations may be performed, e.g., in step 3100 using the processor 320 (discussed in reference to FIG. 1 above).

Equation (8) can be generalized to a polynomial of degree m in T, where m is an integer larger than 2.

The N-parameter CD control graph may be re-calculated (or modified) to compensate for other manufacturing variables using corrective iterations based on results of additional pre-determined tests and measurements. For example, to compensate for non-linearity of the trimming process, the test wafers may be measured based on the thickness of the photoresist mask. The results derived from trimming such wafers may be included, as a corrective factor (i.e., feedback), in calculations of the process time T using equations (7) through (16).

Figure 10:
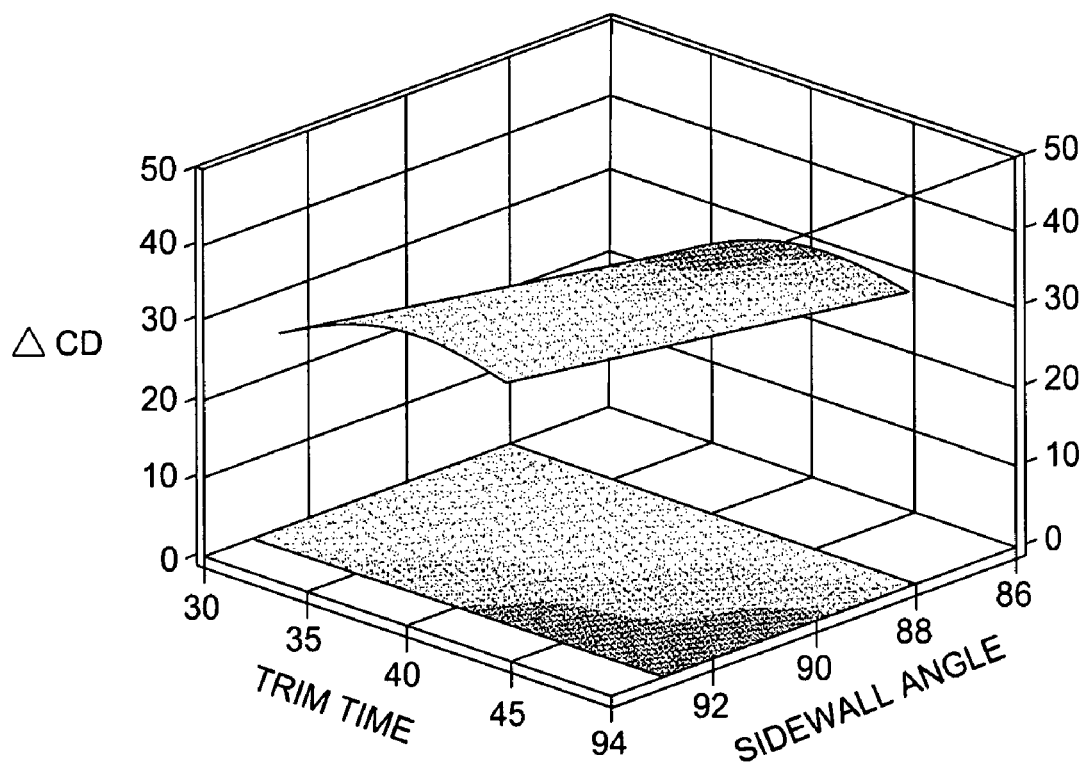
FIG. 10 is a graphical representation a 2-parameter critical dimension (CD) control graph used to calculate a duration of the trimming process in one embodiment of the present invention.

FIG. 10 depicts an illustrative example of a 2-parameter CD control graph where the trim time T is plotted as a function of the ΔCD and sidewall angle. An illustrative example of a 1-parameter CD control graph is depicted in FIGS. 4A and 4B, where the trim time T is plotted as a function of the ΔCD (FIG. 4A) and sidewall angle (FIG. 4B).

Each point on the N-parameter CD control graph represents a solution for the trim time T related to a given set of the measured (i.e., $C_{PRE}$, A, and B) and target ($C_{TARGET}$) parameters of the patterned mask. The processor of the semiconductor wafer processing system can transform such information into the setting for a specific process time (i.e., specific trim time T) for trimming the patterned mask (e.g., photoresist masks) of each one of production wafers.

In further embodiments, a number of parameters that define the N-parameter CD control graph may further be increased to compensate for other manufacturing variables, such as the width of the foot of a critical element of the patterned mask, hardness of the photoresist mask, and the like. Accuracy of calculating the trim time T generally increases along with the number of the parameters (i.e., manufacturing variables) that are used in calculations of the trim time.

At step 824, the pilot product wafers are measured. Thereafter, at step 828, a pilot batch of the product wafers are trimmed using a time interval based on the N-parameter CD control graph. At step 830, the wafers are measured to determine whether the CDs of features are achieved. If the query is negative, the CD control graph is updated and the method proceeds to step 828 and another batch of pilot wafers are processed using a different time interval based on the updated N-parameter CD control graph. If the query of step 830 is affirmatively answered, the method proceeds to step 832.

At step 832, the sequence 800 ends.

In one exemplary application, the disclosed method of calculating the trim time T and the N-parameter CD control graph was used during fabrication of a polysilicon gate electrode of the gate structure of a CMOS transistor. In this application, the target width (i.e., CD) of the element of the patterned photoresist mask was of about 180 nm and the 3σ distribution for such a CD was about 10 nm. With the technology described herein, the post etch distribution of these wafers were tightened to 3.3 nm 3σ with a one parameter (pre-etch CD) CD control graph and 1.8 nm 3σ with a two parameter (pre-etch CD and pre-etch Photomask sidewall angle) CD control graph.

Using the sequence 800A of the present invention, the target range (i.e., post-etched range) of the CDs of the elements of the product wafers was reduced. Specifically, use of the 1-parameter ($CD_{PRE}$) trim surface reduced the range of such distribution to about 3-4 nm 3σ while further use of the 2-parameter ($CD_{PRE}$ and sidewall angle) trim surface further reduced the range to about 2 nm 3σ.

Similar to the embodiment discussed above, the calculated trim time may be further modified to compensate for other manufacturing variables using one or more corrective iterations, as well as the number of parameters defining the N-parameter CD control graph may be greater than three.

The discussed embodiments of the inventive method provide tight statistical distribution of the critical dimensions of the trimmed patterned masks and facilitate high dimensional accuracy of the features etched in the underlying layers when such trimmed masks are used as the etch masks.

The invention may be practiced using other semiconductor wafer processing systems and measuring tools wherein the processing parameters may be adjusted to achieve acceptable characteristics by those skilled in the arts by utilizing the teachings disclosed herein without departing from the spirit of the invention.

Although the forgoing discussion referred to trimming the patterned masks used during etch processes, other processes used for fabricating the integrated circuits can benefit from the invention.

What is claimed is:

1. A method of controlling etch processes during fabrication of semiconductor devices in a semiconductor substrate processing system, comprising:
   providing a substrate having a patterned mask comprising resist features having a first profile and first critical dimensions;
   measuring the first profile and the first critical dimensions by a first optical technique;
   trimming the patterned mask with an etching technique having one or more processing parameters;
   etching an underlying layer on the substrate using the trimmed patterned mask as an etch mask to form features in the underlying layer having a second profile and second critical dimensions;
   measuring the second profile and the second critical dimensions by a second optical technique;
   comparing the first profile and the first critical dimensions with the second profile and the second critical dimensions; and
   adjusting one or more parameters of the etching technique.

2. The method of claim 1, wherein the adjusting one or more parameters of the etching technique further comprises:
   providing the substrate having a trimmed patterned mask comprising resist features having the second profile and second critical dimensions; and
   trimming the patterned mask with another etching technique having one or more adjusted processing parameters.

3. The method of claim 2 wherein the first optical technique comprises using a non-destructive optical measuring tool having at least one measuring instrument.

4. The method of claim 1, wherein the adjusting one or more parameters of the etching technique providing a second substrate having a patterned mask comprising resist features having a first profile and first critical dimensions; and trimming the patterned mask of the second substrate with another etching technique having one or more adjusted processing parameters.

5. The method of claim 1, wherein the measuring the first profile and the first critical dimensions comprises measuring parameters selected from a group consisting of a width of the feature, a sidewall angle width of the feature, a width of a foot of the feature, a thickness of said mask, non-linearity of an etch rate during trimming the feature, and a thickness of the layer beneath the mask.

6. The method of claim 1, wherein the measuring the first profile and the first critical dimensions comprises measuring the width of the feature.

7. The method of claim 1, wherein the one or more processing parameters comprise processing time.

8. The method of claim 7, further comprising modifying said process time using iterations based on measurements of one or more prior processed substrates.

9. The method of claim 1, further comprising calculating a N-parameter critical dimension control graph from the measurement the first profile and the first critical dimensions and the measurement the second profile and the second critical dimensions.

10. An apparatus for controlling etch processes during fabrication of semiconductor devices in a semiconductor substrate processing system, cormprising:

a measuring tool for measuring a profile of a feature of a patterned mask and a feature etched in a layer beneath said mask;

a processor configured to:

measuring a first profile and first critical dimensions of a patterned mask comprising resist features having the first profile and the first critical dimensions by a first optical technique;

trimming the patterned mask with an etching technique having one or more processing parameters;

etching an underlying layer on the substrate using the trimmed patterned mask as an etch mask to form features in the underlying layer having a second profile and second critical dimensions;

measuring the second profile and the second critical dimensions by a second optical technique;

comparing the first profile and the first critical dimensions with the second profile and the second critical dimensions; and adjusting one or more parameters of the etching technique;

an etch reactor performing the trimming of the patterned mask; and an etch reactor performing the etching of said underlying layer using the trimmed patterned mask as an etch mask.

11. The apparatus of claim 10, wherein the measuring tool is a non-destructive optical measuring tool having at least one measuring instrument.

12. The apparatus of claim 10, wherein the measuring the first profile and the first critical dimensions, and the second profile and the second critical dimensions are selected from a group consisting of a width of the feature, a sidewall angle width of the feature, a width of a foot of the feature, a thickness of said mask, non-linearity of an etch rate during trimming the feature, and a thickness of the layer beneath the mask.

13. The apparatus of claim 10, wherein the processor adjusts one or more parameters of the etching technique based on the results of measurements performed by the measuring tool.

14. The apparatus of claim 10, wherein the processor adjusts one or more parameters of the etching technique based on measurements performed on one or more prior processed substrates.

15. The apparatus of claim 10, wherein the processor adjusts one or more parameters of the etching technique using a method comprising:

providing a second substrate having a patterned mask comprising resist features having a first profile and first critical dimensions; and trimming the patterned mask of the second substrate with another etching technique having one or more adjusted processing parameters.

16. The apparatus of claim 10, wherein processes of trimming the patterned mask and etching the layer beneath said mask are performed in one etch reactor.

17. The apparatus of claim 10, further comprising a reactor for stripping the patterned mask.

18. The apparatus of claim 10, further comprising at least one substrate robot for transferring substrates within the apparatus.

* * * * *

UNITED STATES PATENT AND TRADEMARK OFFICE
CERTIFICATE OF CORRECTION

PATENT NO. : 7,498,106 B2  
APPLICATION NO. : 11/263780  
DATED : March 3, 2009  
INVENTOR(S) : Mui et al.

Page 1 of 1

It is certified that error appears in the above-identified patent and that said Letters Patent is hereby corrected as shown below:

<u>In the Claims:</u>

Column 16, Claim 2, Line 60, please insert --trimmed-- after the;

Column 17, Claim 9, Line 24, please insert --of-- after measurement;

Column 17, Claim 9, Line 25, please insert --of-- after measurement;

Column 17, Claim 10, Line 29, please delete "cormprising" and insert --comprising-- therefor;

Column 18, Claim 12, Line 13, please insert --of-- after measuring.

Signed and Sealed this

Second Day of June, 2009

JOHN DOLL  
*Acting Director of the United States Patent and Trademark Office*